United States Patent
Boyden et al.

(10) Patent No.: US 10,856,446 B2
(45) Date of Patent: Dec. 1, 2020

(54) COOLING FOR SLOT MOUNTED ELECTRICAL MODULES

(71) Applicant: Juniper Networks, Inc., Sunnyvale, CA (US)

(72) Inventors: Franklin D. Boyden, Pleasanton, CA (US); Jimmy Chun-Chuen Leung, Fremont, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 220 days.

(21) Appl. No.: 15/892,101

(22) Filed: Feb. 8, 2018

(65) Prior Publication Data

US 2019/0246523 A1 Aug. 8, 2019

(51) Int. Cl.
*H05K 7/20* (2006.01)
*G06F 1/20* (2006.01)

(52) U.S. Cl.
CPC .......... *H05K 7/20636* (2013.01); *G06F 1/20* (2013.01); *H05K 7/2049* (2013.01); *H05K 7/20272* (2013.01); *H05K 7/20445* (2013.01); *H05K 7/20772* (2013.01)

(58) Field of Classification Search
CPC .......... H05K 7/20636; H05K 7/20272; H05K 7/20445; H05K 7/2049; H05K 7/20772; H05K 7/20218–20381; H05K 7/20409–20418; H05K 7/20009–202; H05K 7/2039; G06F 1/20; G06F 1/181–182; G06F 2200/201; G06F 1/183; G06F 1/206; H01L 23/367–3677; H01L 23/473; H01L 23/46–467

USPC .......................................... 361/699, 702, 711
See application file for complete search history.

(56) References Cited

U.S. PATENT DOCUMENTS

| 4,558,395 A | * | 12/1985 | Yamada | ............... H01L 23/4332 |
| | | | | 257/E23.091 |
| 4,644,385 A | * | 2/1987 | Nakanishi | ........... H01L 23/4332 |
| | | | | 165/80.4 |
| 4,870,477 A | * | 9/1989 | Nakanishi | ............. H01L 23/433 |
| | | | | 257/713 |
| 5,050,036 A | * | 9/1991 | Oudick | ................. H01L 23/473 |
| | | | | 165/80.4 |

(Continued)

FOREIGN PATENT DOCUMENTS

| CN | 102257652 A | | 11/2011 |
| CN | 103889195 A | * | 6/2014 |

(Continued)

OTHER PUBLICATIONS

Chen, Yu; Du, Peng; Li, Jiming, "Heat radiation structure of electronic device and communication device provided with heat radiation structure", Huawei Tech Co. Ltd, Jun. 25, 2014, Entire Document (Translation of CN 103889195). (Year: 2014).*

(Continued)

*Primary Examiner* — Jayprakash N Gandhi
*Assistant Examiner* — Stephen S Sul
(74) *Attorney, Agent, or Firm* — Shumaker & Sieffert, P.A.

(57) ABSTRACT

A cooling manifold positioned on an electrical or computer to provide liquid cooling for a plurality of slot-mounted electrical modules received in a corresponding plurally of module slots arranged in faceplate assembly of an electrical or computer card is described and illustrated.

19 Claims, 7 Drawing Sheets

(56) References Cited

U.S. PATENT DOCUMENTS

| | | | | |
|---|---|---|---|---|
| 5,465,192 | A * | 11/1995 | Yoshikawa | H01L 23/433 165/80.4 |
| 5,473,508 | A * | 12/1995 | Porter | H01L 23/467 165/80.3 |
| 6,449,162 | B1 * | 9/2002 | Corbin, Jr. | H01L 23/4006 257/719 |
| 6,807,061 | B1 * | 10/2004 | Harris | H01L 23/36 257/707 |
| 7,385,821 | B1 * | 6/2008 | Feierbach | H01L 23/4332 165/104.33 |
| 7,450,387 | B2 * | 11/2008 | Cheng | H01L 23/367 165/185 |
| 7,836,597 | B2 * | 11/2010 | Datta | F04B 17/00 165/104.33 |
| 8,456,833 | B2 * | 6/2013 | Eagle | H05K 7/20254 165/104.33 |
| 9,258,925 | B2 * | 2/2016 | Arvelo | H05K 7/20772 |
| 9,913,403 | B2 * | 3/2018 | Krug, Jr. | H05K 7/20772 |
| 2004/0112571 | A1 * | 6/2004 | Kenny | F04B 17/00 165/80.3 |
| 2005/0241803 | A1 * | 11/2005 | Malone | G06F 1/20 165/80.4 |
| 2006/0162903 | A1 * | 7/2006 | Bhatti | F28F 3/12 165/104.14 |
| 2007/0091570 | A1 * | 4/2007 | Campbell | H05K 7/2079 361/699 |
| 2011/0141692 | A1 * | 6/2011 | Bult | H05K 7/20672 361/700 |
| 2014/0233175 | A1 * | 8/2014 | Demange | H05K 7/20254 361/679.47 |
| 2015/0077937 | A1 * | 3/2015 | Daly | G02B 6/428 361/700 |
| 2016/0242313 | A1 * | 8/2016 | Singh | H05K 3/0061 |
| 2016/0290728 | A1 * | 10/2016 | Coteus | H01L 23/473 |
| 2016/0338222 | A1 * | 11/2016 | Reeves | H01L 21/4878 |
| 2018/0042137 | A1 * | 2/2018 | Reeves | H01L 21/4878 |
| 2018/0135901 | A1 * | 5/2018 | Hirai | H05K 7/20272 |
| 2018/0228055 | A1 * | 8/2018 | Yoshizumi | H05K 7/20272 |
| 2019/0098798 | A1 * | 3/2019 | Franz | G06F 13/00 |
| 2019/0111862 | A1 * | 4/2019 | Dede | B60R 16/02 |

FOREIGN PATENT DOCUMENTS

| | | | |
|---|---|---|---|
| CN | 105050363 A | 11/2015 | |
| CN | 206610802 U | * 11/2017 | H01L 23/473 |

OTHER PUBLICATIONS

Ludwig, Kraus, "Cooling body, power semiconductor unit and cooling system", Siemens AG, Nov. 3, 2017, Entire Document (Translation of CN 206610802) (Year: 2017).*

English Summary of Office Action received in corresponding Chinese Application No. 2019101001837, dated Mar. 6, 2020, 10 pages.

* cited by examiner

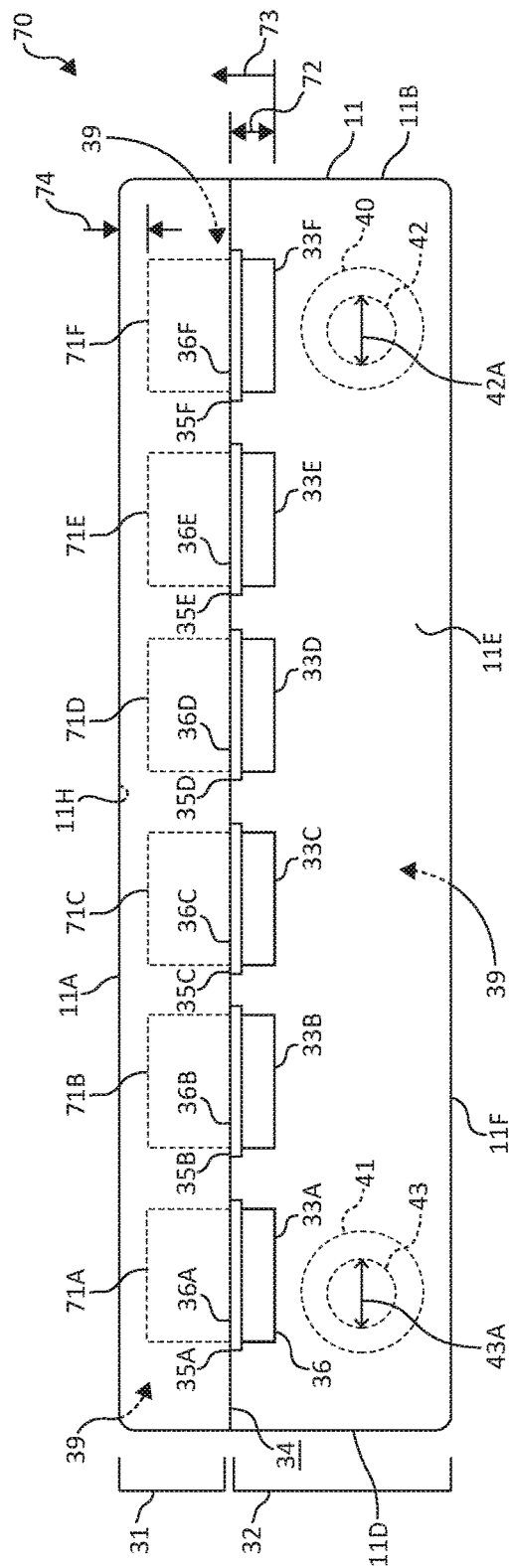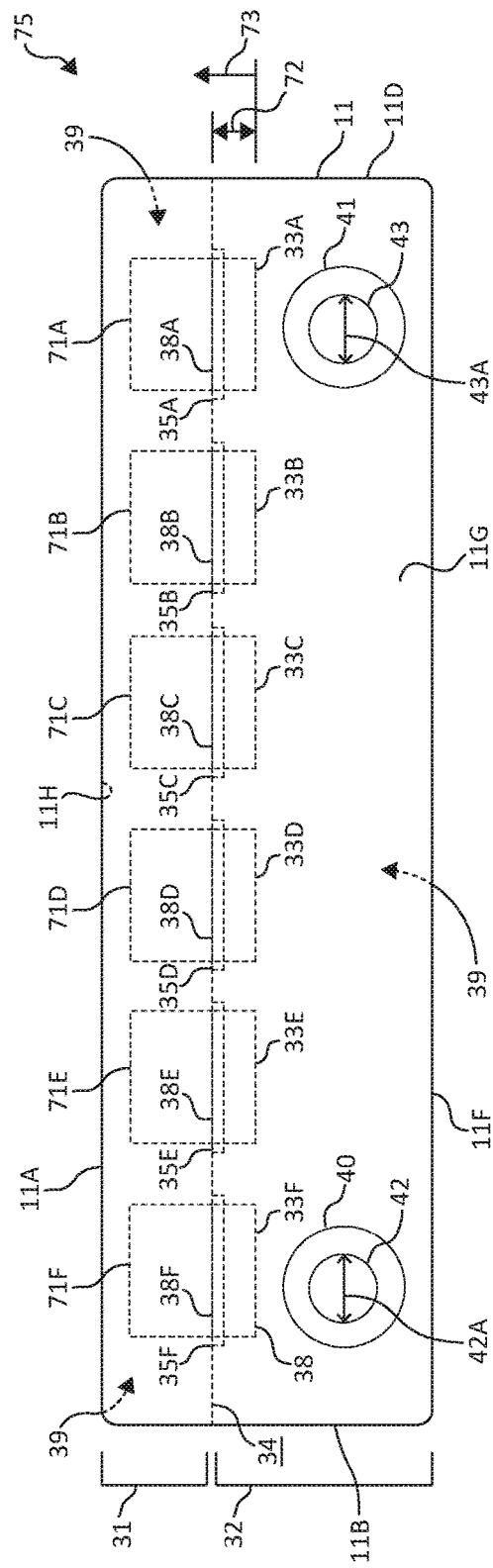

COOLING FOR SLOT MOUNTED ELECTRICAL MODULES

TECHNICAL FIELD

The disclosure relates to cooling slot-mounted electrical modules installed in an electrical or a computer card.

BACKGROUND

For larger computer systems, including mainframe computers, routers, and server systems, electrical components and associated circuitry are often provided on a "card" consisting of at least one "circuit board" generally comprising a flat sheet-like material having a height and a width dimension, the material having a nominal thickness. Various electrical components are mounted to one or both sides of the circuit board. The internal electrical connections between the electrical components located on the card are often formed using electrically conductive traces printed onto or otherwise provided on the material forming the circuit board. In addition, a front edge of a card, referred to as the faceplate of the card, may include a faceplate assembly that includes a plurality of module slots configured to allow the insertion and removal of various types of individual electrical modules, such as optical communication modules, into and from, respectively, each of the module slots. Once an electrical module is installed in one of the plurality of module slots, electrical connectors associated with the module slot are electrically coupled to electrical connectors provided as part of the electrical module in order to provide electrical connections between the devices including on the electrical module and the devices included on the card where the electrical module has been installed.

Additional connections for electrical coupling of the components included within the card and/or with electrical modules installed in module slots on the card to devices or systems that are external to the card are often provided as conductive contacts formed along one edge of the circuit board of the card. In other cases, some or all of the conductive contacts may be provided as part of an electrical connector mounted to a back edge of the card. Often, the contacts are configured such that the card may be releasably inserted into a card socket or a mating electrical connector that also includes electrical connectors or terminals. The electrical connectors or terminals of the card socket or the mating connector may, in turn, be electrically coupled to the external devices or systems, such as other cards or any other types of electrical devices or systems, allowing the conductive contacts on the card to provide electrical connections to these external devices and systems through the card socket.

Card sockets may be provided as part of a computer chassis or rack system including what is often referred to as a "card cage." The card cage includes a rack like structure having a plurality of "slots," each slot configured to accept a card having the proper dimensions and conforming to any other physical parameters designated for cards designed to be accepted by the slot. A card having the proper form factor can be inserted into the slot, and, when fully inserted, engage the card socket or mating connector provided for that particular slot, thus forming the electrical connections between the card and the devices and/or systems that are electrically connected to the contacts or terminals provide in the card socket or mating connector. In some examples, the card and/or the card cage include(s) a mechanism to secure the card in place once the card has been fully inserted into a slot. Once inserted into a slot, the card can also be removed from a slot in order to service the card, thus allowing for replacement of a defective card, or simply to change the type of card provided by the system associated with the card cage.

In addition, a card may include one or more additional components, such as indicator lights, displays including graphic displays, connections such as a standardized port connection, and/or a plurality of module slots as described above, that are located on a "face" portion of the card. A face of a card is often a narrow plate of some material, such as metal, that is mounted to the circuit board on an edge of the card opposite the edge of the card that includes the contacts that are configured to be releasably inserted into the card socket. In general, the additional components on the face of the card are visually and/or physically accessible once the card has been fully inserted into a slot of a card cage. For example, the module slots are generally configured so that individual electrical modules may be inserted and removed from the respective module slots provided with the card from the faceplate area of the card, and without the need to remove the card from the card cage where the card is installed in order to remove or insert the electrical modules.

SUMMARY

In general, the disclosure is directed to a cooling manifold ("manifold") configured to be mounted to a computer or electrical card ("card") comprising electrical components mounted onto a substrate, such as a circuit board or circuit boards. The card may be configured to be insertable and removable from a card slot provided as part of a card cage or a computer card rack. The manifold includes an interior fluid cavity or simply a "interior cavity" that is at least partially enclosed by a housing of the manifold. The interior cavity is arranged to receive a cooling fluid that is circulated within and throughout the interior cavity of the manifold. The housing is also configured to extend over a set of module slots arranged at the faceplate portion of the card where the manifold is installed, each module slot arranged to receive a slot-mountable or "pluggable" electrical module, such as an optical communications module, and to electrically couple to the electrical devices located on the electrical module once the electrical module is fully received in one of the module slots of the card.

The manifold includes a plurality of pedestals that are flexibly coupled to the housing of the manifold through individual sets of flexible bellows. When the manifold is installed on an electrical or computer card, each pedestal of the manifold is positioned adjacent to one of the module slots and extends away from a bottom surface of the housing of the manifold in a direction toward the module slot.

Each pedestal is configured with at least one surface that is arranged to physically engage an outer surface of an electrical module that may be installed in the module slot adjacent to the pedestal. Each pedestal is formed from a thermally conductive material, such as aluminum or copper, and provides a thermal path through the pedestal to an interior surface of the pedestal that is also in fluid communication with the interior cavity of the manifold. Once a pedestal of the manifold has been brought into contact with an electrical module inserted in the module slot adjacent to the pedestal, the exterior surface of the pedestal is urged toward an exterior surface of the electrical module by pressure present on the interior surface of the pedestal by the cooling fluid circulating through the manifold, and thus provides a thermal path to conduct heat away from the electrical module to the cooling fluid through the pedestal.

As such, each pedestal of manifold provides a thermal path from an exterior surface of an electrical module install in a module slot of a card to a cooling fluid circulated throughout the interior cavity of the manifold, and thus provides cooling to each individual electrical module inserted into any of the module slots located adjacent to one of the pedestals of the manifold.

Individual ones of the electrical modules may be inserted and/or removed from the module slots of the card without the need to manipulate or otherwise reconfigure the manifold or any of the pedestals flexibly coupled to the manifold, including the pedestal located adjacent to the module slot were the electrical module is being inserted or removed. In some examples, a plurality of manifolds may be provided on a given electric or computer card, and depending on the number and arrangement of the module slots, may provide cooling for some or all of the electrical modules inserted into the module slots of the electrical or computer card. Circulation of the cooling fluid may include coupling of the cooling fluid circulated through the manifold or manifolds provided on a card with other cooling manifolds located adjacent to other devices, such as integrated circuits, that are located on the substrate of the card and are being cooled by a flow of cooling fluid through these other manifolds. As such, a card may be configured with a cooling system arranged to cool individual electrical modules inserted in module slots located on the card, and to cool other devices located on the circuit board(s) or other substrate(s) provided as part of the card.

As one example, the disclosure is directed to a device comprising a manifold comprising a housing that encloses an interior cavity, the interior cavity configured to receive a cooling fluid within the interior cavity and to circulate the cooling fluid throughout the interior cavity, and a plurality of pedestals, each of the pedestals individually and flexibly coupled to the housing and comprising an interior surface in fluid communication with the interior cavity, wherein each pedestal is configured to extend outward from a bottom surface of the housing when a fluid pressure is present within the interior cavity, and wherein each of the pedestals is formed from a thermally conductive material configured to transfer heat from an exterior surface of the pedestal to the interior surface of the pedestal through the thermally conductive material. The manifold is configured to be positioned adjacent to a plurality of module slots of a faceplate assembly of a card, and each of the plurality of pedestals positioned adjacent to one of the plurality of module slots so that each of the pedestals, when extended away from the bottom surface of the housing, is configured to physically contact an electrical module received in respective module slots of the faceplate assembly adjacent to the pedestal and provide a thermal path to conduct heat from the electrical module to the interior cavity through the pedestal.

In another example, the disclosure is directed to a cooling system for an electrical or computer card, the cooling system comprising a circuit board comprising a faceplate assembly, the faceplate assembly comprising a plurality of module slots, each module slot configured to receive and slot-mountable electrical module and electrically couple to the electrical module once the electrical module is received in the module slot, and at least one manifold secured to the circuit board or to the faceplate assembly, and positioned adjacent to the faceplate assembly. The at least one manifold comprises a housing that encloses an interior cavity, the interior cavity configured to receive a cooling fluid within the interior cavity and to circulate the cooling fluid throughout the interior cavity, a plurality of pedestals, each of the pedestals individually and flexibly coupled to the housing and comprising an interior surface in fluid communication with the interior cavity, wherein each pedestal is configured to extend outward from a bottom surface of the housing when a fluid pressure is present within the interior cavity, and wherein each of the pedestals is formed from a thermally conductive material configured to transfer heat from an exterior surface of the pedestal to the interior surface of the pedestal through the thermally conductive material. The manifold is positioned to have each of the plurality of pedestals positioned adjacent to one of the plurality of module slots so that each of the pedestals, when extended away from the bottom surface of the housing, is configured to physically contact an electrical module received in the module slot of the faceplate assembly adjacent to the pedestal and provide a thermal path to conduct heat from the electrical module to the interior cavity through the pedestal. The cooling system includes a set of tubing coupling the at least one manifold to a source of cooling fluid, the tubing configured to provide fluid communication between the source of cooling fluid and the at least one manifold.

In another example, the disclosure is directed to a method comprising supplying a cooling fluid to a manifold, the manifold coupled to a card configured to be installed and electrically powered in a computer card rack, the manifold positioned adjacent to and configured to thermally cool a plurality of slot-mountable electrical modules received in a set of module slot of the card while the card in installed within a card slot of the computer card rack, and circulating a cooling fluid through an interior cavity of the manifold to transfer heat from a surface of the at least one of the electrical modules through a portion of the housing of the manifold and to the cooling fluid to thermally cool the at least one electrical module received in a module slot of the card. The manifold comprises a housing that encloses an interior cavity, the interior cavity configured to receive the cooling fluid within the interior cavity and to circulate the cooling fluid throughout the interior cavity, and a plurality of pedestals, each of the pedestals individually and flexibly coupled to the housing and comprising an interior surface in fluid communication with the interior cavity, wherein each pedestal is configured to extend outward from a bottom surface the housing when a fluid pressure is present within the interior cavity, and wherein each of the pedestals is formed from a thermally conductive material configured to transfer heat from top surface of the pedestal to the interior surface of the pedestal through the thermally conductive material, wherein the manifold having each of the plurality of pedestals positioned adjacent to one of the plurality of module slots so that the each of the pedestals, when extended away from the bottom surface of the housing, comes into physical contact with an electrical module received in the module slot of the faceplate assembly adjacent to the pedestal and provides a thermal path to conduct heat from the electrical module to the interior cavity through the pedestal.

The details of one or more examples of the techniques of this disclosure are set forth in the accompanying drawings and the description below. Other features, objects, and advantages of the techniques will be apparent from the description and drawings, and from the claims.

BRIEF DESCRIPTION OF DRAWINGS

FIG. 5 is a front side elevational view of the example cooling manifold of FIG. 3 in accordance with one or more example implementations and techniques described in this disclosure.

FIG. 6 is a rear side elevational view of the example cooling manifold of FIG. 3 in accordance with one or more example implementations and techniques described in this disclosure.

DETAILED DESCRIPTION

Figure 1:
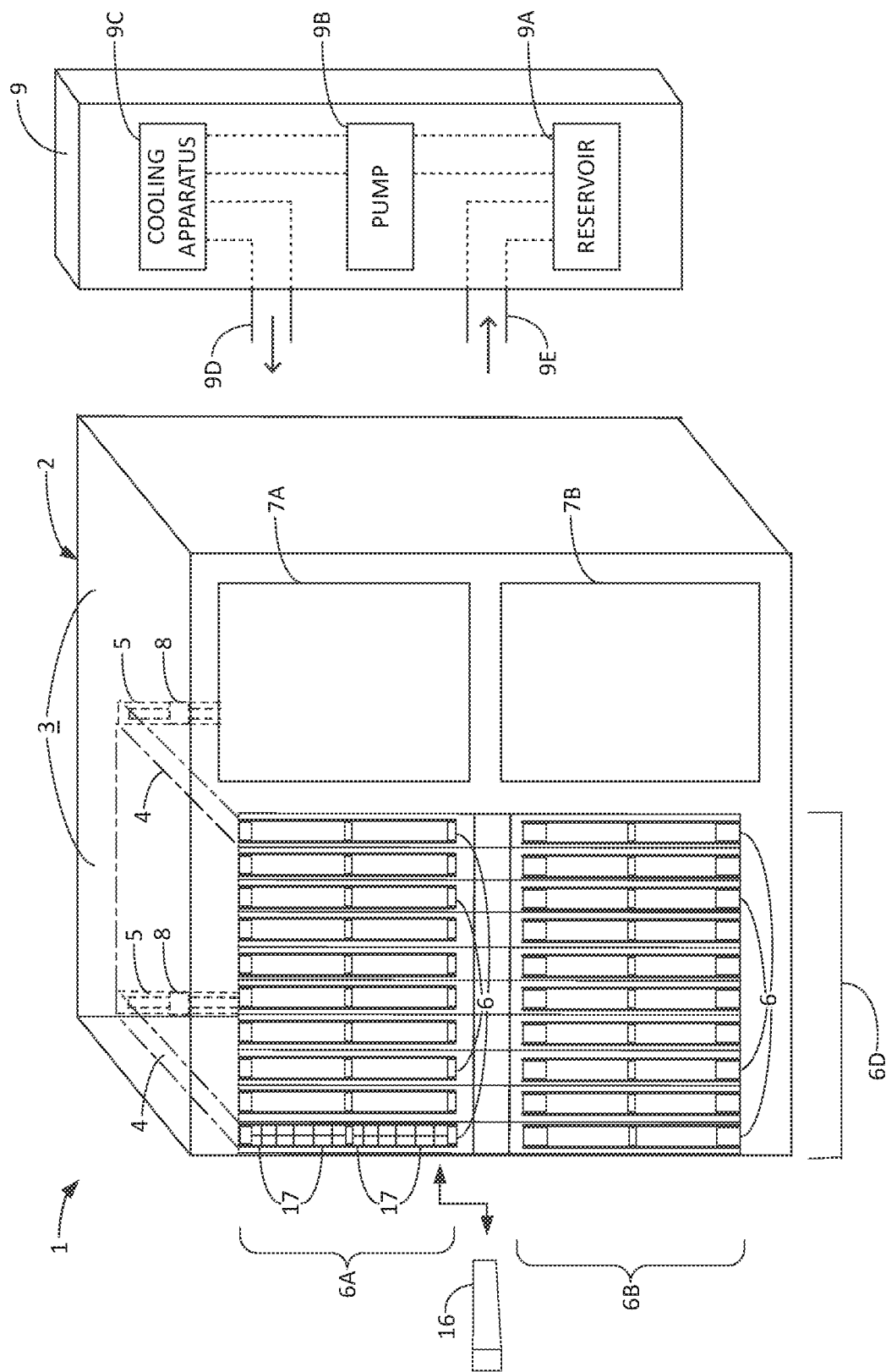
FIG. 1 is a perspective view illustrative of a computer rack including a plurality of cards within the computer rack including slot mounted devices and a cooling system in accordance with one or more example implementations and techniques described in this disclosure.

Maintaining the operating temperature for electronic devices of an electrical system to within some predefined operating temperature range, or at least below a maximum operating temperature, is often a critical component in ensuring the proper and reliable operation of an electrical system. The various electrical devices of an electrical system may be arranged for example as computers, computer components such as processor and memory circuits, routers, and servers, which may be mounted on various types of computer or electrical cards. The computer or electrical cards are often configured to be mounted in card racks or card cages, and in close proximity to one another. The heat generated by the powering and operation of the electrical devices, in particular in configurations having multiple cards placed in close proximity to one another, can create some issues with respect to cooling of the electrical devices and/or with general removal of the heat generated by a plurality of cards inserted and operating in a card rack. To compound the issues related to heating, these computer or electrical cards may be located, powered, and operated in a card cage that may include multiple rows of cards inserted and operating in the same card rack, wherein one or more of the rows of cards may be positioned over other rows of cards within the card rack.

In addition to the plurality of cards and other devices, such as power supplies, that may be installed and operating in a card rack, individual ones of the cards may further include a module slot assembly provided as part of the faceplate of a card. The module slot assembly may include a plurality of module slots configured to allow insertion of a variety of different types of electrical modules, such as optical communication modules, into each of the plurality of module slots. The electrical modules, once inserted into a module slot of the module slot assembly, may be electrically coupled to other electrical devices that are included on the card where the module slot is provided, and may also be electrically connected to other electrical modules inserted in other module slots provided as part of the module slot assembly on the same card.

Air cooling using a flow of air circulated through the card cages and the cards themselves has been used in the past as the technique for cooling the electrical devices located on the cards. As power densities inside of systems continues to rise, liquid cooling becomes an attractive alternative method to transfer heat out of the system. Generally, not all components can be liquid cooled, however, so a hybrid of liquid and air cooling may be required to cool and maintain proper operation temperatures for some electrical systems. Lower power density components may remain air cooled, while high power density components would be liquid cooled. In general, the more heat that can be removed by liquid cooling, the more efficient the cooling system for an electrical system including cards may be overall.

Moreover, making the slot-mountable electrical modules liquid cooled may provide several advantages, including more efficient cooling of these devices, less system airflow required (that may also lower noise levels in the area of the systems due to the reduced airflows), and a wider operating temperature range for the system, as some of the slot mountable electrical modules (e.g., optical communication modules) are particularly sensitive to heat. Various difficulties of providing individual cooling for each of these slot mountable electrical modules may include that there are typically many such devices on a single card, and each electrical module needs to have a thermal interface that can individually make appropriate thermal contact with the corresponding electrical module intended to be cooled. In the past, individual sets of heat sink fins were arranged over each of the module slots that required cooling, the heat sink fins typically held in place, individually, by some type of spring clip arrangement. These arrangements rely on air cooling using an air flow over the heat sink fins, which could be relatively inefficient in transferring heat away for the electrical module in very high-density configurations of the card, for example where many module slots, and thus many electrical modules, are positioned in close proximity to one another. In addition, the individual spring clips holding a set of heat fins to each individual electrical module installed in the module slots of a card may be susceptible to breakage or snapping out of place, and thus may not hold the heat sink fins in proper alignment and/or in a good state of physical and/or thermal contact with the particular electrical module that the heat sink fins were installed to cool.

Examples of the cooling manifolds and the cooling systems described in the disclosure include a liquid cooled manifold that may be installed on a card that includes a plurality of module slots that can be used to receive a variety of slot-mountable electrical modules, including but not limited to slot-mountable optical communication modules. The manifold includes a plurality of pedestals formed from a thermally conductive material, the pedestals flexibly coupled to a housing of the manifold. When the manifold is positioned on a card, each pedestal of the manifold is located adjacent to an opening provided in a portion of a module slot so that each pedestal may extend and make physical contact with an exterior surface of an electrical module that is installed in the adjacent module slot. A housing of the manifold includes an interior cavity that is configured to receive a cooling fluid to be circulated throughout the interior cavity. Each of the pedestals of the manifold is in fluid communication with the interior cavity and any cooling fluid circulating within the interior cavity. Fluid pressure exerted by the cooling fluid on each pedestal provides an outward force on the flexibly mounted pedestals to assure good physical contact and thermal coupling of the pedestals to the exterior surface of the electrical modules received in the module slots adjacent to each pedestal.

In some examples, each pedestal is individually coupled to the housing of the manifold through a flexible bellows, allowing each pedestal to individually adjust and make contact with any electrical module that may in inserted into the module slot adjacent to that particular pedestal. As such, individual variations in the mounting slots and/or variations in the surfaces of the electrical modules received in the module slots is compensated for the by individual flexible coupling of the pedestal to the manifold housing. The arrangement of the manifold and pedestals solves several problems, including the problem of providing liquid cooling to a plurality of slot-mountable electrical modules installed on a card. For example, this arrangement allows a single manifold to provide cooling to a plurality of slot-mountable electrical modules, including allowing each pedestal to make individually adjustable contact at the thermal interface between the pedestal and the adjacently installed electrical module. Further, individual electrical modules may be inserted and removed from the module slots of the card where the manifold is installed without the need to make any adjustments or perform any manipulation of the cooling manifold, the pedestals, or the card itself.

FIG. 1 is a perspective view illustrative of a card rack system 1 including a plurality of cards 6 installed in card cage 2 including slot mounted devices and a cooling system 9 in accordance with one or more example implementations and techniques described in this disclosure. In various examples, card rack system 1 may be a stand-alone unit, or may be one portion or unit associated with a larger rack assembly system, wherein card rack system 1 may be stacked and/or attached to other racks or units so as to be above or below these other rack assemblies or units (not shown in FIG. 1), or other types of electrical and/or computer equipment, such as but not limited to power supplies, printers, displays, keyboards, and/or keypads, and/or one or more addition rack(s) configured to house additional card cage(s) (also not shown in FIG. 1).

Card rack system 1 may be configured to be coupled to external cooling system 9 in order to provide thermal cooling to the electrical modules included with one or more of cards 6 inserted into the card slots of card cage 2 of system 1, and in some examples to one or more additional electrical devices that may be included in card cage 2. Cooling system 9 may be a fluid-based cooling system that utilizes a liquid, such as water, as a medium to conduct heat away from the electrical devices located on any of cards, electrical modules, and in some examples additional devices located in card cage 2, as further described below. Cooling system 9 may include reservoir 9A for holding a quantity of the cooling fluid utilized by cooling system 9 to cool the electrical devices of card cage 2, a pump 9B to provide pressure to circulate the cooling fluid through the cooling system, and a cooling apparatus 9C, such as a heat exchanger or a refrigeration unit, configured to remove heat from and reduce the temperature of the cooling fluid being circulated through the cooling system. Once cooled by the cooling apparatus 9C, pump 9B provides a pressure to cause the cooling fluid to exit outlet 9D of cooling system 9, to circulate through the cooling systems provided within card cage 2 to remove heat from electrical devices located within the card cage, and then to return to cooling system 9 through inlet 9E. The returning cooling fluid received at inlet 9E may enter reservoir 9A for cooling again by cooling apparatus 9C and to be recirculated by pump 9B through outlet 9D for further cooling of the electrical devices located within card cage 2.

As illustrated in FIG. 1, card rack system 1 includes a card cage 2 comprising a card rack area, generally indicated by bracket 6D, configured to house a plurality of electronic and/or computer cards 6 (hereinafter "card" or "cards 6"). Use of the terms "card" and "cards" is not limited to a reference to any particular type of card or types of cards, and can include any types and configurations of electrical devices, such as integrated circuits and/or passive devices, which are mounted on a substrate or other medium, such as a circuit board, and wherein the card is physically configured to be installed in a position within the card rack area indicted by bracket 6D of card cage 2. In the example of card cage 2 shown in FIG. 1, an upper row 6A of card cage 2 is configured to accommodate a total of ten cards 6, and a lower row 6B of card cage 2 is configured to accommodate another ten cards 6.

In addition to the individual cards 6, one or more of the cards 6 may include a plurality of module slots 17, each of the module slots arranged to receive an individual slot-mountable electrical module 16, such as an optical communications module. Each of module slots 17 may be arranged to allow insertion and removal of an individual electrical module, such as slot-mountable electrical module 16, without the need to install or remove card 6 from card cage 2. Depending on the type of module, the electrical modules illustratively represented by electrical module 16 may be installed in one of module slots 17 while card 6 and/or the module slot itself is "hot," e.g., is electrically powered. The ability to configure one or more of cards 6 with a plurality of individual electrical modules adds additional flexibility to the configuration of cards installed in the card rack system 1, and thus to the various features and functions that may be provided by the electrical devices incorporated into cards 6 and card cage 2. As shown in FIG. 1, only the left-most card 6 in upper row 6A of card cage 2 is illustrated as having module slots 17. It would be understood that some or all of the additional cards 6 that could be, or that are installed in card cage 2, may include module slots 17, and the illustration as shown in FIG. 1 is a non-limiting example of an arrangement of cards 6 in card cage 2 that may include module slots 17.

In various examples, card cage 2 may include one or more additional areas 7A, 7B located for example adjacent to the card rack area indicated by bracket 6D. Additional areas 7A and 7B may be used for securing additional devices, such as visual display panels, indicator lights such as light emitting diodes (LEDs), connectors for making additional electrical connections between cards 6 and devices external to card cage 2, or additional slots for more electronic and/or computer cards. The numbers, types and configuration of the devices that may be included within or secured in additional areas 7A and 7B are not limited to any particular numbers, types of, or configurations of devices, and may be any such devices and arrangements of devices as would be understood by one of ordinary skill in the art related to electronic and/or computer systems and electronic and/or computer hardware devices.

Card cage 2 may include vertically aligned tracks or grooves forming individual slots (e.g., card slots 4) configured to allow insertion and removal of each of the plurality of cards 6 to and from, respectively, card cage 2. In general, one card 6 is configured to be inserted into one of the card slots 4 in card cage 2, wherein card slot 4 is defined by the tracks or grooves arranged for guiding the insertion and removal of a card into and out of, respectively, a given one of card slots 4 in the card rack area of card cage 2. Card cage 2 includes a back side having a back-side interior surface 3 onto which a plurality of card sockets 5 may be mounted. Each card socket 5 includes a plurality of electrical contacts and is mounted on the interior surface 3 of the back side of card cage 2 in a position so as to engage electrical contacts or terminals of any card 6 that is installed into the particular card slot 4 associated with that card socket 5. When a card 6 is fully inserted into a card slot 4, card socket 5 associated with that card slot is configured to engage the electrical contacts or terminals on that particular card, and to provide electrical connections between electrical devices located on the card 6 and the electrical contacts or terminals included in the card socket 5 associated with that card slot 4. These connections to the electrical devices located on the received card may include connections to one or more of the electrical devices that are included on one or more electrical modules installed in one or more module slots 17 provided with card 6. As would be understood by one of ordinary skill in the art, each of card sockets 5 may be wired to other sockets, and/or one or more other device(s) included within card rack system 1, and/or to external devices, busses, or other electrical and/or computer systems and devices (not shown in FIG. 1) to provide electrical connections between the electrical devices located on cards 6 installed in card cage 2 and other cards 6 and/or the systems and devices located externally to card rack system 1.

In addition to a socket 5 providing electrical connects to a card 6 that is inserted in any card slot 4 of card cage 2, socket 5 may also include a fluid coupling 8 positioned at one or more of card slots 4. Fluid coupling 8 may be arranged to engage a mating type fluid connector (not shown in FIG. 1, but e.g., fluid coupling 21 as illustrated and described with respect to FIG. 2) on card 6 inserted and fully received into card slot 4. Fluid coupling 8 is coupled to a source of cooling fluid, such as cooling system 9. The cooling fluid provided by cooling system 9 may comprise a liquid, such as water, that may be provided to a cooling system including at least one cooling manifold incorporated onto any of cards 6 that may be inserted into card slot 4. When a card 6 having a cooling system incorporated into the card is fully received in a card slot 4 that includes a fluid coupling 8, the fluid coupling 8 may be engaged with a mating fluid coupling located on the card so that a cooling fluid provided to the fluid coupling 8 is coupled to and circulates through the cooling system provided with the card 6, and is then returned to the fluid coupling 8 to provide thermal cooling to devices located on the card.

In some examples of the card cage 2, each individual one of the sockets 5 associated with each of card slots 4 in the card rack area includes at least one fluid coupling 8 arranged to couple with a mating fluid coupling of a card 6 inserted in the respective card slot 4 in examples of cards 6 that include the mating connector. In other examples of card cage 2, only certain ones of the card slots 4 are aligned with sockets 5 that also include a fluid coupling 8. For example, a card cage 2 may be arranged so that only card slots 4 on the upper row 6A, or only card slots 4 on lower row 6B, are associated with sockets 5 that also include fluid couplings 8. Because cards 6 are specifically designed to be inserted and removable from the card cage 2 with a minimum number of steps required to accomplish the insertion and any subsequent removal of the card, it may be important to be able to connect the fluid coupling 8 with the cooling system of a card 6 without additional steps, or with only a minimum amount to additional process steps. In some examples, this may be achieved through the use of devices such as check-ball valves or other mechanical devices incorporated into the fluid coupling 8 that allow the fluid connection between the fluid coupling 8 and the cooling system of the card 6 to be achieved automatically, upon insertion of card 6 into slot 4 where fluid coupling 8 is positioned. In other examples, a technician may manually perform the coupling required between fluid coupling 8 of card cage 2 and the mating fluid coupling provided on a card 6 once the card 6 has been inserted into card slot 4 in order to provide the fluid coupling and cooling for the inserted card 6.

In the examples of cooling systems described in this disclosure, a card 6 that includes a cooling system as part of the card assembly and that also includes module slots as part of the faceplate assembly provided with the card may include one or more cooling manifolds positioned adjacent to the module slots. Each cooling manifold further includes a plurality of pedestals that are flexibly coupled to the cooling manifold, each pedestal arranged in a position adjacent to one of the module slots and configured to physically contact an external surface of an electrical module installed in the slot adjacent to where the pedestal is located, and to provide a thermal path for conduction of heat from the electrical module through the pedestal and to a cooling fluid circulating through an interior cavity of the cooling manifold.

In general, a predefined and limited space is allocated with respect the height and width dimensions of the faceplate area each of the cards, and further, the total amount of space between each of cards 6 when installed in a card cage 2 is also limited based on the configuration of the card cage and the cards themselves. These spacing and dimensions may be defined by various standards. Because the cooling manifolds as described herein are configured to be installed on cards having at least some predefined spatial constraints, and are configured to be attached as part of the card where they are installed to provide cooling to electrical modules inserted into the module slots on the card, the cooling manifolds as described herein are configured with a low profile designed to allow insertion and removal a card 6, including the those portions of cooling system including the cooling manifolds, without the need for any additional manipulation or steps, or with a minimum amount of steps, related to the connections and the disconnection of the cooling system located on the card 6.

The devices, systems, and techniques described in this disclosure for cooling systems provided with a card, such as any of cards 6, include low profile arrangements of the devices of the cooling system that do not extend beyond the sides of (width dimensions) of the faceplate of the card 6 on which they are installed. As such, the cards 6 that include the cooling systems as described herein may be inserted into a card cage, such as card cage 2, between any two already installed cards without the need to manipulate the cooling system on the card 6 being installed in any way other than coupling a source of cooling fluid to the cooling system on the card itself. Further, if a card 6 having a cooling system including one or more manifolds according to the examples described in this disclosure needs to be removed from the card cage 2, the low profile arrangement of the cooling systems for the cards according to the devices, systems, and techniques described in this disclosure allow removal of the card without the need for any additional manipulation related to the cooling system included with the card itself (other than to disconnect the source of the cooling fluid from the card), even when the card 6 that is to be removed from the card cage 2 is located between two other cards installed in the card slots immediately adjacent to and on both sides of the card being removed.

As further described below, the cooling manifold according to the various examples described in this disclosure includes a plurality of pedestals flexibly mounted to a housing of the manifold. Due at least in part to the flexibly coupled arrangement of each of the pedestals to the cooling manifolds as described herein, each module slot included on a card 6 and located adjacent to one of the pedestals may have an electrical module inserted into and removed from the module slot without the need for any additional steps related to manipulation of the cooling system.

Once an electrical module is installed in a module slot of a card adjacent to a pedestal of a cooling manifold configured according to the various examples described in this disclosure, the pedestal will automatically be extended by virtue of fluid pressure within the interior cavity of the manifold to physically and thermally contact the installed electrical module, and thus provide a thermal path for cooling of the electrical module without the need to otherwise manipulate the cooling system or the pedestal in any manner. The installed electrical module can also be removed at some later time from the module slot by simply extracting the electrical module from the module slot, again without the need for any additional steps or manipulation of the cooling system or the pedestal that is located adjacent to the module slot were the electrical module is removed. Various examples and features of a cooling manifold that may be utilized in the cooling systems described in this disclosure, are further illustrated and described below with respect to FIG. 2-7.

Figure 2:
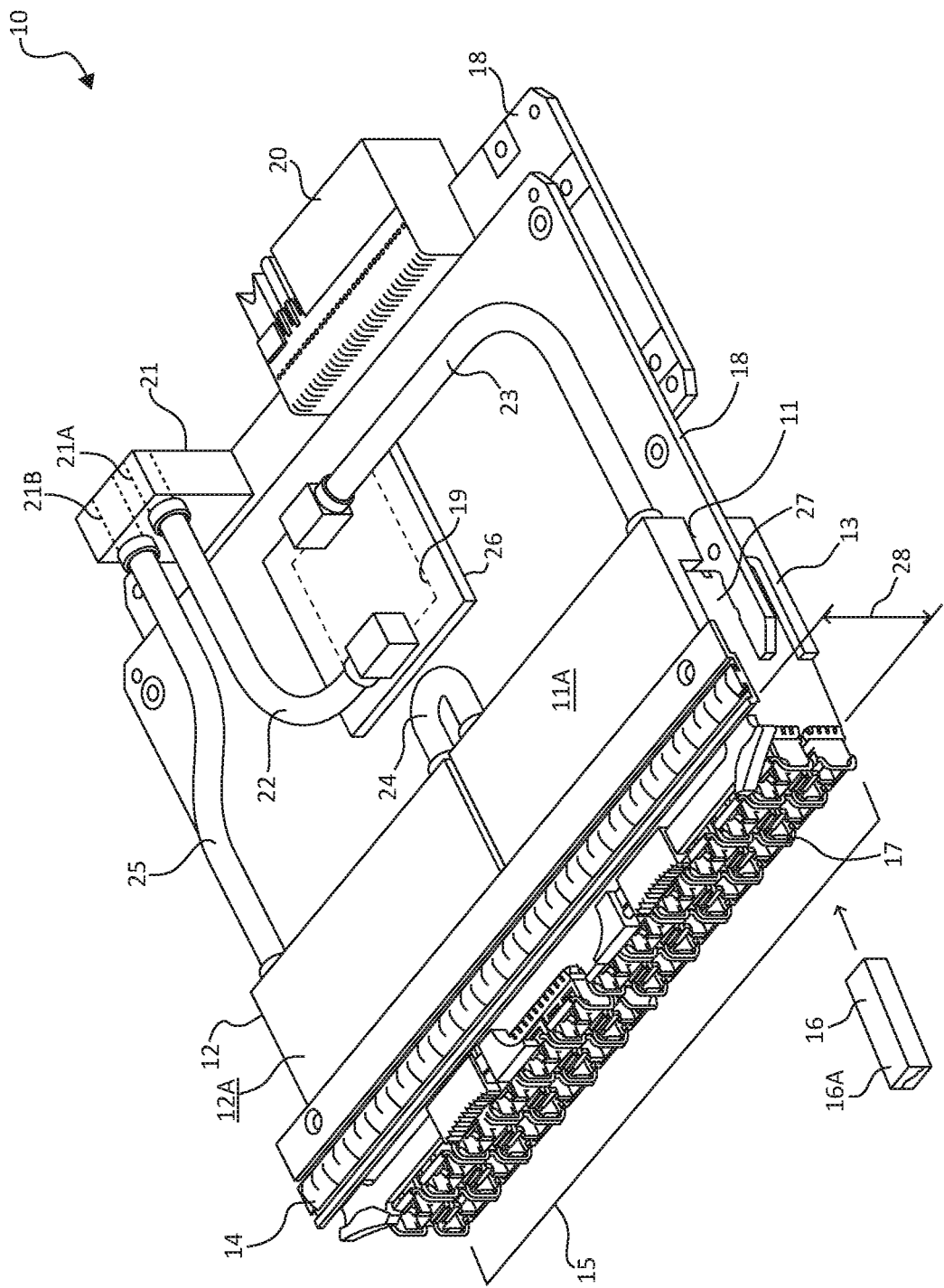
FIG. 2 is a perspective view of an example card including a plurality of cooling manifolds in accordance with one or more example implementations and techniques described in this disclosure.

FIG. 2 is a perspective view of a circuit board assembly 10 including cooling manifolds 11, 12, and 13 for cooling slot mounted devices in accordance with one or more example techniques described in this disclosure. Assembly 10 may represent an example of one or more of cards 6 illustrated and described above with respect to FIG. 1. As shown in FIG. 2, assembly 10 includes one or more electrical circuit boards 18 coupled to a faceplate assembly 14. Faceplate assembly 14 includes a plurality of module slots, generally indicated by bracket 15, and including example module slot 17, arranged along a front edge of circuit boards 18. The module slots included in faceplate assembly 14 include individual opening in the faceplate assembly 14 that are configured to receive a slot-mountable electrical module, such as electrical module 16. When electrical module 16 is fully received in a module slot such as module slot 17, the electrical module 16 may be electrically coupled to various components, such as an integrated circuit 19, that are mounted to and electrically coupled with electrical conductors, (e.g., electrically conductive traces not specifically shown in FIG. 2) located on the surface of circuit boards 18. In addition to or in the alternative, when an electrical module such as electrical module 16 is fully received in a module slot 17 of the faceplate assembly 14, the electrical module 16 may be coupled, through electrical connector associated with module slot 17 and conductors on circuit boards 18, to one or more terminals included in connector assembly 20. Connector assembly 20 as shown in FIG. 2 is mounted to a back edge of circuit boards 18 opposite the front edge where faceplate assembly 14 is mounted.

Assembly 10 is configured to be inserted, in its entirety, into a card slot of a computer rack (e.g., slot 4 of card cage 2 of FIG. 1), so that when assembly 10 is fully inserted into the card slot, connector assembly 20 is mechanically and electrically coupled with a mating connector within the computer rack (e.g., socket 5 in FIG. 1), and thus may provide electrical connections between any electrical modules mounted in the module slots of the faceplate assembly 14, electrical devices located on circuit boards 18, and other devices located externally to assembly 10, such as electrical devices located on other computer cards installed in the same computer rack, or in other computer racks. In addition, because the module slots included with the faceplate assembly 14 are mounted on the front edge of circuit boards 18, access to the module slots is maintained when assembly 10 is fully received in a card slot of a card cage. This allows for insertion and removal of electrical modules, such as electrical module 16, to and from, respectively, any of the module slots included in the faceplate assembly 14 without the need to remove assembly 10 from the computer rack where assembly 10 may be installed. Faceplate assembly 14 may also include various features, such as threaded holes in the faceplate assembly 14 that allow fasteners, such as a threaded screw, to engage the cage assembly of a computer rack in some manner once assembly 10 has been fully received in the computer rack to secure the assembly 10 in a fully received position within the computer rack.

The electrical module 16 is not limited to any particular type of device, and in some examples, is an optical communication module, configured as an optical transceiver that may be used in high-bandwidth data communication applications. When fully received in a module slot of faceplate assembly 14, such as module slot 17, and having assembly 10 received into a card slot of a card cage (not shown in FIG. 2) so that the assembly 10 is electrically powered, the electrical modules such as electrical module 16 that are fully received in the slots of faceplate assembly 14 may perform various electrical and communication functions which the devices are configured to perform. In the process of operating under power and performing various electrical and communication functions, the devices themselves may generated thermal heat and experience an increase in temperature of the device. The generated thermal heat may raise the temperature of the electrical module itself, and at some point may increase the temperature of the electrical module to a point where the performance of the electrical module may be adversely affected, and/or damage to the components of the electrical module may occur. Therefore, cooling the electrical modules, such as electrical module 16, once the devices are fully received in the slots of the faceplate assembly 14 and operating may be required to maintain a proper operating range of temperature for the slot-mounted electrical modules. The cooling may aid in maintaining the electrical module at a temperature or within a range of temperatures that assures the device will not overheat, and potentially fail, either temporarily or permanently due to a thermal overheating of the electrical module.

An example of a system for cooling a plurality of slot-mountable electrical modules that may be received in module slots of faceplate assembly 14 is illustrated as part of the assembly 10 in FIG. 2. The cooling system includes a cooling manifold 11 that is positioned on one side of circuit boards 18 near the faceplate assembly 14, and extending over a first set of the module slots in the faceplate assembly 14. Cooling manifold 11 includes a top surface that extends over a set of the module slots provided by faceplate assembly 14 in the area where manifold 11 has been positioned. Top surface 11A also extends past a side portion 27 of the module slots. As shown in FIG. 2, manifold 11 may include a portion of the manifold that extends down and makes contact with some area on circuit boards 18. This portion of the manifold 11 that extends beyond the side portion 27 and contacts circuit boards 18 may be fastened to the circuit boards, for example using straps, clips, and/or threaded fasteners (none shown in FIG. 2) to secure the manifold in place relative to faceplate assembly 14.

As further described below, cooling manifold 11 includes a plurality of pedestals that flexibly extend from a housing of the cooling manifold, each pedestal located adjacent to one of the module slots of the cage assembly. Each pedestal is configured to physically engage and to be thermally coupled to an electrical module that is received in the module slot the pedestal is located adjacent to, and to provide a thermally conductive path arranged to conduct heat away from the electrical module through the pedestal to a cooling fluid being circulated through the cooling manifold 11. In some examples, cooling manifold 11 includes a particular number of pedestals, such as six pedestals, wherein cooling manifold 11 extends over a corresponding number of module slots, i.e., six module slots of faceplate assembly 14. As such, cooling manifold 11 is arranged to provide thermal cooling to a set of six electrical modules inserted into the six adjacent module slots on a first side of faceplate assembly 14 as shown in FIG. 2.

In a similar manner, the cooling system of assembly 10 further includes another cooling manifold 12 that is positioned on the same side of circuit boards 18 as cooling manifold 11, and adjacent to an additional portion of faceplate assembly 14 not covered by cooling manifold 11. Cooling manifold 12 extends over a second set of the module slots provided in faceplate assembly 14, on a same side of circuit boards 18 but adjacent to a different set of module slots relative to cooling manifold 11. In a manner similar to that described above with respect to cooling manifold 11, cooling manifold 12 also includes a plurality of pedestals, each of the pedestals located adjacent to one of the slots of faceplate assembly 14, and configured to physically engage and thermally coupled to an electrical module that is received in the module slot located adjacent to that pedestals of cooling manifold 12, and to provide a thermally conductive path arranged to conduct heat away from the electrical module through the pedestal and to a cooling fluid being circulated through the cooling manifold 12.

As shown in FIG. 2, the faceplate assembly 14 of assembly 10 includes a total of twelve module slots on one side of circuit boards 18, and each of the twelve slots is adjacent to a corresponding pedestal provided by one of the cooling manifolds 11 or 12. As such, each electrical module that may be inserted into one of the module slots on the side of circuit boards 18 located on the same side of circuit boards 18 as cooling manifolds 11 and 12 may be cooled by the operation of the cooling system including manifolds 11 and 12. In various examples, addition cooling module 13, (and any additional cooling module(s) not specifically shown in FIG. 2 but included with assembly 10) may be positioned on a side of circuit boards 18 opposite the side of circuit boards 18 where cooling manifolds 11 and 12 are located. These additional cooling manifolds may be configured in a similar manner as describe above with respect to cooling manifolds 11 and 12, but positioned to physical and thermally engage sets of electrical modules installed into module slots located below the module slots in FIG. 2 being engaged by cooling manifolds 11 and 12.

In addition to one or more cooling manifolds such as cooling manifolds 11, 12, and 13, the cooling system provided with an assembly 10 may include fluid coupling 21, tubing 22, 23, 24, and 25, and a chip cooling manifold 26. As shown in FIG. 2, fluid coupling 21 includes fluid openings 21A and 21B. In some examples, fluid opening 21A is configured to receive a cooling fluid provided by a cooling system, such as cooling system 9 as shown in FIG. 1. As shown in FIG. 2, fluid coupling 21A is coupled to tubing 25 at a first end of tubing 25, A second end of tubing 25 is coupled to a fluid inlet to cooling manifold 12. Tubing 24 couples a fluid outlet of cooling manifold 12 to a fluid inlet of cooling manifold 11. A first end of tubing 23 is coupled to a fluid outlet of cooling manifold 11. A second end of tubing 23 is coupled to a fluid inlet of chip cooling manifold 26. Manifold 26 provides an interior cavity that allow cooling fluid to flow an area adjacent to integrated circuit 19, and cool integrated circuit 19 positioned underneath and in thermal contact with manifold 26. A first end of tubing 22 is coupled to a fluid outlet of manifold 26. A second end of tubing 22 is coupled to fluid opening 21B of fluid coupling 21. The fluid coupling 21, along with manifolds 11, 12, and 26, in conjunction with tubing 22, 23, 24 and 25 provide a sealed system that allows cooling fluid received at fluid opening 21A to circulate though manifolds 12 and 11 to provide cooling to slot-mounted electrical modules located in the faceplate assembly 14, and through manifold 26 to provide cooling to integrated circuit 19. The circulating cooling fluid then exits the cooling system of assembly 10 through fluid opening 21B, and may return to the external cooling system that is providing the cooling fluid to assembly 10.

It would be understood that the flow of cooling fluid as described above could circulate in the reverse direction, so that the cooling fluid would enter fluid coupling 21 through fluid opening 21A, flow through manifold 26, then through manifolds 11 and 12, and exit the cooling system of assembly 10 through fluid coupling 21B. While not shown in FIG. 2, additional manifolds used to cool additional devices located on circuit boards 18 may be included as part of a cooling system provided with assembly 10. Additional tubing (not shown in FIG. 2) may be used to couple cooling fluid received at fluid coupling 21 to manifolds 13 and any additional manifold(s) provide on the opposite side of circuit boards 18 relative to the side where manifolds 11, 12 and 26 are located. As also illustrated by FIG. 2, the manifold 11, 12, 13, and any additional manifold provided to cool slot-mountable electrical modules on assembly 10 extend over the modules slots, but do not extend beyond the width dimension 28 of the faceplate assembly 14. This feature allows assembly 10 to be inserted and/or removed from a slot of a card rack such as card cage 2 (FIG. 1) without the need to manipulate the manifolds relative to the assembly 10 in any manner, even in instance where the assembly 10 is being inserted or removed from a card slot where other cards are present on both side of the slot where assembly 10 is being inserted or removed.

The example and arrangement of manifolds, tubing, and fluid couplings as shown in FIG. 2 is an illustrated and non-limiting example of one possible arrangement of a liquid cooling system that may be provide on a card such as assembly 10. In some examples, a different number of manifolds 26 may be including as part of the cooling system, including assemblies that include no examples of manifolds 26 arranged to cool integrated circuits or other devices mounted directly to circuit boards 18, and include only cooling manifolds arranged to cool slot-mounted electrical modules located in a faceplate assembly 14 of the card. In addition, the number of cooling manifolds arranged to provide cooling to slot-mountable electrical modules on examples of assembly 10 are not limited to any particular number or manifolds, and may include only a single manifold, or a plurality of manifolds.

Figure 3:
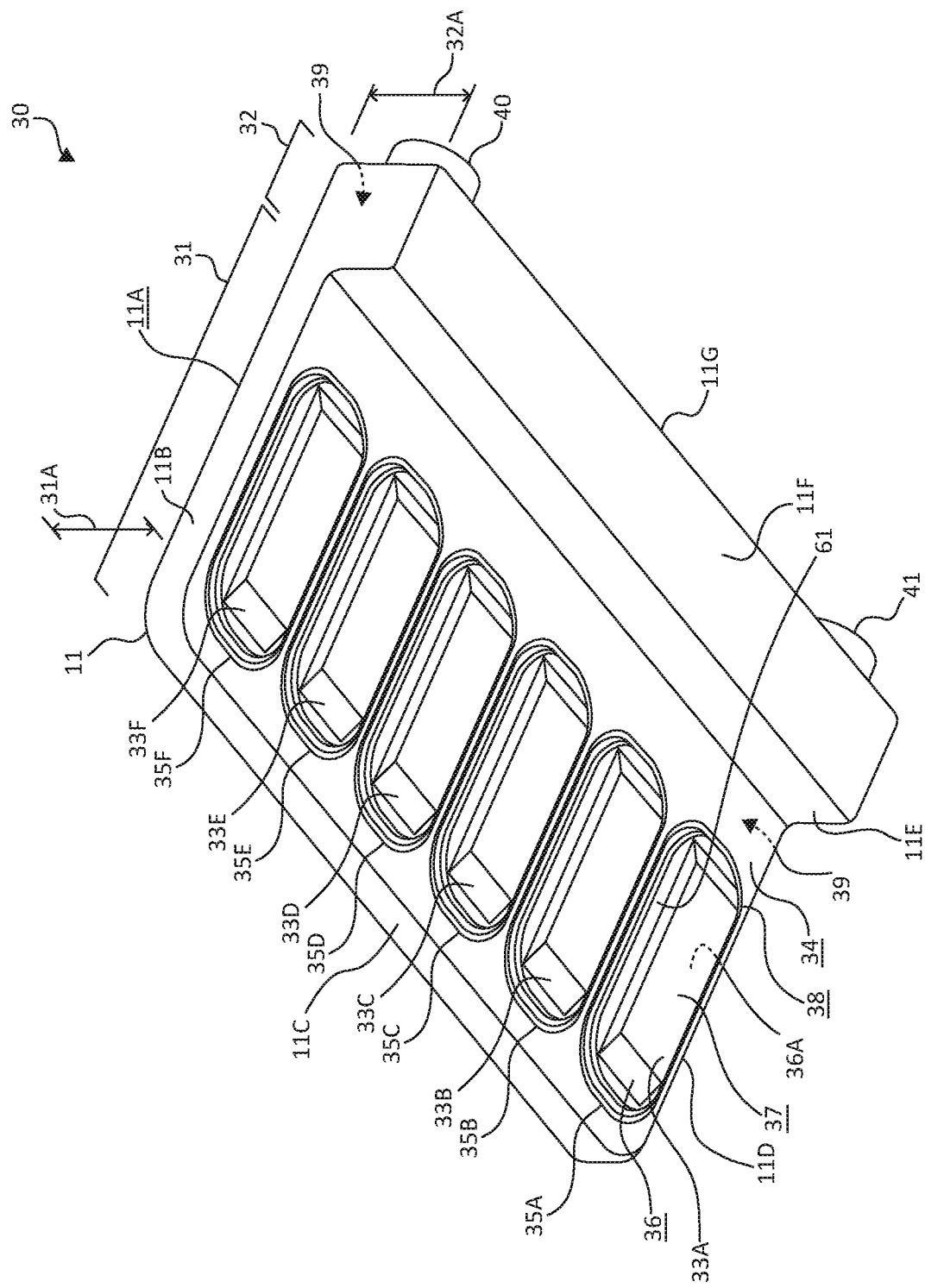
FIG. 3 is a perspective view of an example cooling manifold including a plurality of pedestals in accordance with one or more example implementations and techniques described in this disclosure.

FIG. 3 is a perspective view 30 of an example cooling manifold 11 in accordance with one or more example implementations and techniques described in this disclosure. Manifold 11 as shown in FIG. 3 may be an example of manifolds 11, 12, and/or 13 as illustrated and described with respect to FIG. 2. As shown in FIG. 3, manifold 11 includes a first portion 31 comprising top surface 11A coupled to a bottom surface 34 of the first portion 31 by sidewalls 11B, 11C, and 11D. Top surface 11A, sidewalls 11B, 11C, and 11D, and bottom surface 34 at least partially enclose an interior cavity 39 formed within manifold 11. Top surface HA is a generally planar surface, and bottom surface 34 is also generally a planar surface lying in a parallel plane relative to top surface 11A. The spacing between the top surface 11A and the bottom surface 34 provided by sidewalls 11B, 11C, and 11D creates a thickness dimension 31A for the first portion 31 of manifold 11. The three-dimensional space that is formed as the internal cavity 39 that is at least partially enclosed by the first portion 31 of manifold 11 may generally be a rectangular prism shape.

Manifold 11 may further include a second portion 32 that may be partially formed by top surface 11A, extended portions of side wall 11B and 11D, a step 11E, a bottom surface 11F, and an end wall 11G as illustrated in FIG. 3. As shown in FIG. 3, top surface 11A and side walls 11B and 11D of the first portion of manifold 11 extend in the same planes where these surfaces lie relative to first portion 31. The surface of step 11E extends away in a perpendicular plane from bottom 34 to bottom surface 11F. Bottom surface 11F extends in a plane that is perpendicular to step 11E, and is parallel to both top surface 11A and bottom surface 34. End wall 11G extends in a plane that is parallel to step 11E, is perpendicular to top surface 11A and bottom surface 11F, and joins with both top surface 11A and bottom surface 11F, forming an additional side wall of the manifold 11. The portions of both side walls 11B and 11D that extend into second portion 32 also join each of step 11E, bottom surface 11F, end wall 11G, and top surface 11A to at least partially enclose another portion of interior cavity 39 formed within the interior of manifold 11. The three-dimensional space that is formed as an interior cavity that is at least partially enclosed by the second portion 32 of manifold 11 is also generally a rectangular prism shape, having a thickness dimension 32A that is larger than the thickness dimensions 31A of the first portion of the manifold 11. The portion of interior cavity 39 formed within manifold 11 by first portion 31 of manifold 11 is open to and in fluid communication with the portion interior cavity 39 that is at least partial enclosed by the second portion 32. First portion 31 and second portion 32 in combination may be referred to as the housing of manifold 11.

A pair of through-couplings 40 and 41 are positioned along the end wall 11G and spaced apart from one another along end wall 11G. Each of the through-coupling 40 and 41 include an opening forming a passageway through the coupling to provide a path for a flow of fluid through the coupling, and linking interior cavity 39 of manifold 11 with the areas outside the manifold. In some examples, first fluid coupling 40 is coupled to end wall 11G, and provides a through opening configured to allow passage of fluid through the coupling 40 to or from interior cavity 39 to the exterior of manifold 11. Second fluid coupling 41 is also coupled to end wall 11G, and includes a through opening configured to allow passage of fluid through the coupling 41 to provide fluid communication between interior cavity 39 of manifold 11 and the exterior of the manifold.

Bottom surface 34 includes a plurality of pedestals 33A-33F that are individually and flexibly coupled to bottom surface 34 via bellows 35A-35F, respectively. Although manifold 11 in FIG. 3 is illustrated as including six total pedestals extending from bottom surface 34, examples of manifold 11 are not limited to having a particular number of pedestals, and examples of manifold 11 may have a number of pedestals that is more or less than the six pedestals 33A-33F as illustrated in FIG. 3.

Using pedestal 33A as an illustrative example, pedestal 33A is flexibly coupled to the bottom surface 34 of manifold 11 through bellows 35A. Pedestal 33A includes an interior surface 36A (not visible in FIG. 3) that is in fluid communication with interior cavity 39 of manifold 11, and a top surface 37. Top surface 37 may be a planar surface that may generally lie in a plane that is parallel to a plane where the bottom surface 34 lies, and is separated from the plane in which the bottom surface lies by a thickness of the pedestal. Pedestal 33A may extend away from bottom surface 34 along a ramp 36 at a first end of pedestal 33A that is closest to sidewall 11C, and may extend away from bottom surface 34 along a ramp at a second end of pedestal 33A that is closest to step 11E. Each of the pedestals may include a pedestal base, illustratively represented as pedestal base 61 of pedestal 33A in FIG. 3. Pedestal base 61 may be coupled to and encircled by the bellows for that pedestal, for example bellows 35A for pedestal 33A. Bellows 35A encircles pedestal base 61 of pedestal 33A, and is sealed to the pedestal base 61 to form a leak-proof liquid seal between the pedestal and the bottom surface 34. Ramp 36 may extend between pedestal base 61 and a plane that includes top surface 37 at some non-perpendicular angle relative to top surface 37 and forming a sloped surface for ramp 36 extending between the portion of pedestal 33A coupled to bellows 35A and top surface 37 of pedestal 33A at the end of pedestal closest to sidewall 11C. Ramp 38 may extend between the pedestal base 61 and the plane that includes top surface 37 at some non-perpendicular angle relative to top surface 37 and forming a sloped surface extending between the portion of pedestal 33A coupled to bellows 35A and top surface 37 of pedestal 33A at the end of pedestal 33A closest to step 11E.

Ramp 36 may provide a lead-in surface that allows a top surface, such as top surface 16A of an electrical module 16 as illustrated and described in FIG. 2 to engage ramp 36 of pedestal 33A, and to move pedestal 33A in a direction that pushes the top surface 37 of pedestal 33A closer to bottom surface 34 through flexing of bellows 35A. The flexing of bellows 35A allows the top surface 37 of pedestal 33A to move inward toward interior cavity 39 of manifold 11 enough to allow insertion of the electrical module into the module slot of an electrical or computer card that is adjacent to the top surface 37 when manifold 11 is installed on the card, while allowing top surface 37 to remain in physical and thermal contact with the top surface 16A of the electrical module when the electrical module is fully received in the module slot. The elastic resilience provided by the bellows 35A coupling pedestal 33A to the bottom surface 34 of the first portion 31, may provide a force that urges the top surface 37 to remain in contact with the exterior surface of the electrical module inserted in the module slot adjacent to pedestal 33A. In addition, any fluid pressure present in the interior cavity 39 of manifold 11 may also urge the top surface of pedestal 33A to remain in physical contact with the exterior surface of the electrical module inserted into the module slot adjacent to pedestal 33A. The use of the term "urge" or "urged" in this disclosure means to push or apply a force, which may include a static force such as weight, pressure, elastic force, including a force applied to an object without causing motion, but can also refer to forces applied to an object that cause the object to move, for example in a particular direction, as a result of the applied force.

When the electrical module is fully installed in the module slot and is in physical contact with pedestal 33A, pedestal 33A provides a thermal path to conduct heat from the top surface 16A of the electrical module to top surface 37 of pedestal 33A, and through the material forming pedestal 33A to the interior cavity 39 of manifold 11. A cooling fluid being circulated within the interior cavity 39 may then remove the heat transferred through pedestal 33A from the interior surface 36A of pedestal 33A, wherein the cooling fluid may then be circulated through and out of the interior cavity 39 of manifold 11 to further transfer the heat away from electrical module 16 and pedestal 33A.

Ramp 38 may provide a lead-in surface that aids the removal and disengagement of pedestal 33A from being in contact with an electrical module 16 when the electrical module is being withdrawn, e.g., removed, from a module slot located adjacent to pedestal 33A. As described above, when an electrical module is installed in a module slot adjacent to pedestal 33A, top surface 37 of pedestal 33A is maintained in contact with the exterior surface of the electrical module. Pressure on the interior surface 36A of pedestal 33A provided by the cooling fluid within the manifold may also continue to provide pressure against pedestal 33A, urging pedestal 33A to maintain contact with the exterior surface of electrical module 16 with some amount of force exerted on the exterior surface of the electrical module. As the electrical module 16 is pulled out of the module slot where the electrical module had previously been fully received, the exterior surface of the electrical module will move in a direction away for step 11E and toward the front sidewall 11C. As electrical module 16 moves in this direction, the slope of ramp 38 will tend to push pedestal 33A away from any edges, such as a back-side lip of the electrical module, and toward interior cavity 39 of manifold 11, thus helping top surface 37 engage and clear any such edges, thus easing the extraction of the electrical module.

In a similar manner as described above with respect to pedestal 33A, each of pedestals 33B-33F is arranged along bottom surface 34 of manifold 11 so that each pedestal may be positioned adjacent to a different module slot within a same card, and arranged to be flexibly, coupled to the bottom surface 34 through bellows 35B-35F, respectively, as described above with respect to pedestal 33A. Each of the pedestals 33B-33F may include the ramped surfaces extending from the pedestal base of the pedestal to the respective top surface of the pedestal, and arranged to bring the top surface of the respective pedestals into physical and thermal contact with an electrical module that may be inserted into a module slot adjacent to the pedestal. Each of pedestals 33B-33F provides a thermal path configured to transfer heat from an exterior surface of an electrical module received in the module slot adjacent to the pedestal, and to provide a thermal path to transfer heat from the exterior surface of the electrical module through the pedestal and to the interior cavity 39 of the manifold 11, where a cooling fluid circulating within interior cavity 39 may be used to transfer the heat away from the pedestals. As further illustrated and described below with respect to FIGS. 5, 6, and 7, the interior surfaces e.g., interior surface 36A of pedestal 33A) of the pedestals may include a set of heat sinks, e.g., fins, formed of a thermally conductive material, that are physically and thermally coupled to the interior surfaces, respectively, of pedestals 33A-33F. These heat sinks may expand the total surface area of the interior surfaces of pedestals 33A-33F, and increase the efficiency in transferring heat from the pedestals to the cooling fluid.

First portion 31 and second portion 32 forming the housing of manifold 11 are not limited to comprising of any particular type of material. In some examples, the housing of manifold 11 may comprise a thermally conductive material, such as aluminum, stainless steel, or titanium. In other examples, the housing of manifold 11 may comprise in insulative type material, such as a plastic material including but not limited to any polycarbonate type of material. Pedestals 33A-33F may be formed using a thermally conductive material, such as but not limited to aluminum or copper. Bellows 35A-35F may be formed of a type of material that is flexible, such as a stamped beryllium copper material. In other example, bellows 35A-35F may be formed from a flexible material such as a compound comprising rubber or a silicone material. Bellows 35A-35F may be configured to include a series of ridges and valleys, somewhat like the bellows of an accordion, to aid in allowing the bellows to flex while remaining coupled to both bottom surface 34 and each of the respective pedestals 33A-33F. Bellows 35A-35F may be bonded to bottom surface 34 and to each of pedestals 33A-33F using any technique for bonding together the types of material used to form these respective components, including use of thermal welding techniques. When assembled as shown in FIG. 3, first portion 31, second portion 32, bellows 35A-35F, and pedestals 33A-33F form a sealed enclosure at least partially enclosing interior cavity 39 with the exception of the openings provided through fluid couplings 40 and 41. The sealed enclosure in configured to allow circulation of a cooling fluid throughout interior cavity 39, while preventing the cooling fluid from escaping the sealed enclosure except to be receive and exhausted from the manifold through the fluid couplings 40 and 41.

Figure 4:
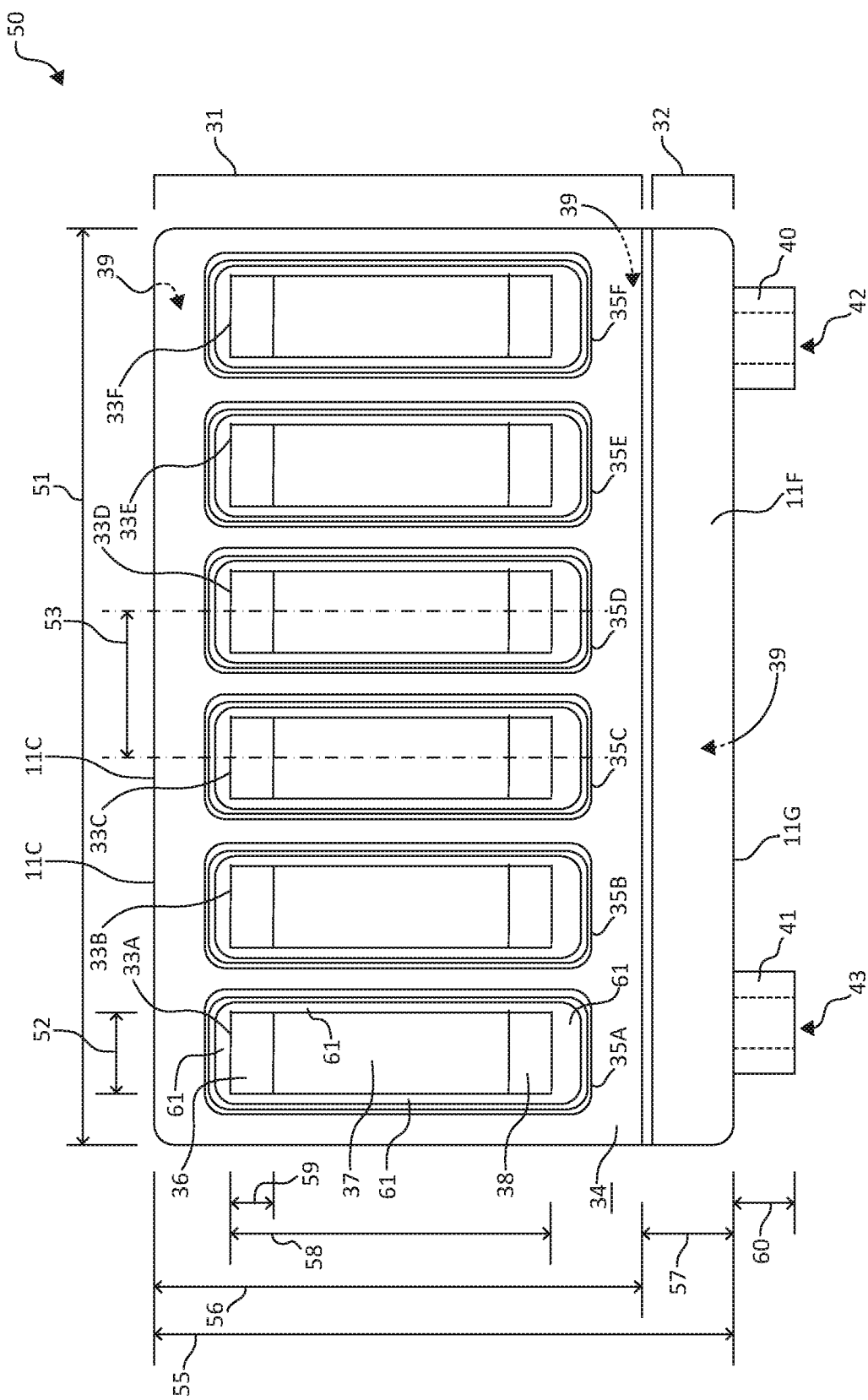
FIG. 4 is a bottom side plan view of the example manifold of FIG. 3 in accordance with one or more example implementations and techniques described in this disclosure.

FIG. 4 is a bottom side plan view 50 of the example manifold of FIG. 3 in accordance with one or more example implementations and techniques described in this disclosure. In FIG. 4, first portion 31 of manifold 11 includes six pedestals 33A-33F, each pedestal flexibly coupled to bottom surface 34 of first portion 31 through bellows 35A-35F, respectively. Second portion 32 of manifold 11 includes a portion of interior cavity 39 that is open to and in fluid communication with the portion of interior cavity 39 the extents within the first portion 31 of manifold 11. Second portion 32 includes fluid coupling 40 having an opening 42 extending through fluid coupling 40, and fluid coupling 41 having an opening 43 extending through the fluid coupling 41. Openings 42 and 43 provide fluid communication between interior cavity 39 and the areas external to manifold 11. As described above, a cooling fluid may be provided to interior cavity 39 through one of opening 42 or 43. The cooling fluid may then circulate throughout interior cavity 39 to exchange heat from the interior surfaces of pedestals 33A-33F, and any cooling fins provided within the interior cavity 39 associated with pedestals 33A-33F, before exiting manifold 11 through the other one of openings 42 or 43.

As shown in FIG. 4, manifold 11 may have an overall rectangular shape relative to the outside perimeter of the manifold when viewed as shown in FIG. 4, with a length dimension 51 in a range from 3 to 15 centimeters, and a width dimension 55 in a range from 4 to 8 centimeters. Length dimension 51 may vary depending on the number of pedestals included with the manifold, and for example may be smaller when less pedestals are included, and may be greater when more pedestals are included in the manifold, compared the six-pedestal example illustrated in FIG. 4. As shown in FIG. 4, first portion 31 and second portion 32 of manifold 11 may both extend along the entirety of the length dimension 51. First portion 31 of the manifold may extend for a width dimension 56 in a range from 3 to 7 centimeters, and second portion 32 may extend for a width dimension 57 in a range from 1 to 3 centimeters. Each of the pedestals 33A-33F may have a rectangular shaped outer perimeter when viewed as shown in FIG. 4, and having a length dimension 58 in a range from 2 to 6 centimeters running parallel to the width dimension 55 of manifold 11, and a width dimension 52 in a range from 5 to 20 millimeters running parallel to the length dimension 51 of the manifold. A center-to-center dimension 53 for a distance between longitudinal axes running parallel to width dimension 55 of the manifold and between the longitudinal center lines of any two adjacent pedestals may be in a range from 10 to 20 millimeters. The actual value for center-to-center dimension 53 may be dependent on the standard used and the spacing between module slots of a particular faceplate assembly (not shown in FIG. 4, but for example faceplate assembly 14 as shown in FIG. 2) that manifold 11 is designed to accommodate for the purpose of providing liquid cooling to the electrical modules received in the module slots of the faceplate assembly.

Each of pedestals 33A-33F as shown in FIG. 4 includes a set of ramps (e.g., ramps 36 and 38 illustratively shown for pedestal 33A) extending from the portion of the pedestal that contacts the bellows (bellows 35A for pedestal 33A) surrounding the pedestal and the top surface 37 of the pedestal. The longitudinal dimension 59 of the ramps, for example ramps 36 and 38, running parallel to width dimension 55 of the manifold may be in a range from 1 to 5 millimeters) for each of ramps 36 and 38, respectively. In various examples, ramp 36 is symmetrical to ramp 38 with respect to overall dimensions and slope of each pedestal, although examples of ramps 36 and 38 are not limited to being symmetrical relative with one another. In some example the longitudinal dimension 59, and thus the slope of ramp 36 may be different compared to the longitudinal dimension, and thus the slope, of ramp 38.

As shown in FIG. 4, each pedestal may include a pedestal base, illustratively represented as pedestal base 61 for pedestal 33A. Pedestal base 61 may include a generally planar surface that encircles the ramp 36, top surface 37, and ramp 38 portions of the pedestal, and couples the pedestal to the bellows (e.g., bellows 35A for pedestal 33A). The dimensional value for the pedestal base 61 extending between the ramps 36, 38, and top surface 37 of the pedestal and the closest portion of the bellows adjacent to these portions of the pedestal may be in a range from 0 to 5 millimeters. That dimensional value may not be equal for all portions of pedestal base 61 around the ends and sides of the pedestal. In some examples, the dimensional value for pedestal base 61 may be larger at the end portions of the pedestal adjacent to ramps 36, 38, compared to the dimensional value for the pedestal base 61 extending between the bellows and the side portions of the pedestal adjacent to top surface 37.

FIG. 5 is a front side elevational view 70 of the example cooling manifold of FIG. 3 in accordance with one or more example implementations and techniques described in this disclosure. In FIG. 5, first portion 31 of manifold 11 is shown looking toward sidewall 11C of first portion 31 of the manifold and looking toward step 11E of second portion 32 of the manifold. Top surface 11A forms the upper perimeter of manifold 11, bottom surface 11F forms the lower perimeter of the manifold, sidewall 11B forms the right-hand side, and sidewall 11D forms the left-hand side of the perimeter of the manifold as illustrated in FIG. 5. Fluid coupling 40 including opening 42 and fluid coupling 41 including opening 43 are located on the side of second portion 32 opposite step 11E, and thus are shown as dashed-line circles in FIG. 5. Each of openings 42 and 43 may extend through fluid couplings 40 and 41, respectively, having a circular shaped opening in cross-section, and having an inside diameter (ID) in a range from 2 to 10 millimeters.

Each of pedestals 33A-33F are coupled to the bottom surface 34 of the first portion 31 of manifold 11 by bellows 35A-35F, respectively. In addition, each of pedestals 33A-33F extend below the bottom surface 34 of the first portion 31 so that a ramp portion of each pedestal, illustratively indicated on pedestal 33A as ramp 36, would be visible when viewing manifold 11 as shown in FIG. 5. As described above, ramp 36 would be the first portion of a pedestal, such as pedestal 33A, to engage an electrical module that is being inserted into a module slot adjacent to the location of pedestal 33A when manifold 11 is installed on a card. The sloped surface of ramp 36 allows the device to engage pedestal 33A and to move past ramp 36 so that the upper surface of the device first engaging ramp 36 may be advances along a longitudinal axis of the pedestal. As the electrical module engages ramp 36, pedestal 33A would be urged upward in a direction indicated by arrow 73, to allow the electrical module to extend along ramp 36 and engage top surface 37 of the pedestal. The range of upward movement of pedestal 33A if provided through the flexibility of bellows 35A coupling the pedestal to bottom surface 34, which may be indicated by the range of movement arrow 72, and in some examples, may include an amount of travel in a range from 0.5 to 1 millimeter.

When fully received in the module slot adjacent to pedestal 33A, an exterior surface of an electrical module is positioned adjacent to and in physical contact with the top surface 37 of pedestal 33A. The elastic resilience provided by the bellows 35A coupling pedestal 33A to the bottom surface 34 of the first portion 31 may provide a force that urges the top surface 37 to remain in contact with the exterior surface of the electrical module inserted in the module slot adjacent to pedestal 33A. In addition, any fluid pressure present in the interior cavity 39 of manifold 11 may also urge the top surface 37 of pedestal 33A to remain in physical contact with the exterior surface of the electrical module inserted into the module slot adjacent to pedestal 33A. In some examples, a pressure exerted by the cooling fluid within interior cavity 39 of manifold 11 may be in a range from 5 to 10 pounds per square inch.

The combination of the elastic force exerted by the bellows and the pressure provided against the interior surface of pedestal 33A by the cooling liquid urges top surface 37 toward the exterior surface of the electrical module, and thus provides physical and thermal contact between the external surface of the electrical module and top surface 37 of pedestal 33A. Pedestal 33A, being formed from a thermally conductive material, provides a thermal path to conduct heat away from the exterior surface of the electrical module through pedestal 33A and to the interior surface of the pedestal. The interior surface of pedestal 33A is in fluid communication with interior cavity 39 of manifold 11, and thus is exposed to the cooling fluid being circulated within and throughout interior cavity 39. The cooling fluid is further arranged to conduct heat away from the interior surface of pedestal 33A, and thus provide cooling to the electrical module located adjacent to pedestal 33A.

In some examples, each of pedestals 33A-33F includes a heat sink, such as a set of heat sink fins 71A-71F, respectively, coupled to the interior surfaces, respectively, of the pedestals. Referring to pedestal 33A, a set of heat sink fins 71A may extend away from the interior surface 36A of pedestal 33A toward top surface 11A. The heat sink fins 71A may comprise a plurality of square or rectangular shaped fins having an edge along a thickness dimension of each fin physically coupled with interior surface 36A of the pedestal. Heat sink fins 71A are formed of a thermally conductive material, such as aluminum or copper, and provide additional surface area exposed to the cooling fluid circulating within and throughout interior cavity 39 of manifold 11. As such, heat sink fins 71A may help transfer heat from interior surface 36A of pedestal 33A to the cooling fluid, increasing the efficiency of the cooling of any electrical module positioned in a module slot adjacent to pedestal 33A and in thermal contact with pedestal 33A.

In some examples, heat sink fins 71A may be formed from a same material as pedestal 33A, or in other examples, may be form from a different thermally conductive material compared to the material used to form pedestal 33A. In some examples, heat sink fins 71A and pedestal 33A are formed as a single piece of material. In other examples, heat sink fins 71A are formed separately from pedestal 33A, and are physical attached to the interior surface 36A of pedestal 33A, for example using a welding or boning technique that establishes an efficient thermal coupling between the interior surface 36A and the heat sink fins 71A.

In a similar manner, each of pedestals 33B-33F may include a set of heat sink fins 71B-71F, respectively, coupled to the respective interior surfaces of each pedestal. Heat sink fins 71B-71F may include any of the features, and perform any of the functions for the respective pedestal these heat sink fins are coupled to as described above with respect to heat sink fins 71A and pedestal 33A. When any of heat sinks such as heat sink fins 71A-71F are provided as part of manifold 11, the extension of the fins away from the respective interior surfaces of the pedestals may not extend into a clearance spacing 74 that is to be maintained between the upper most portion of the fins and the interior side 11H of first portion 31 that includes top surface 11A. The dimensional value for clearance spacing 74 may be determined based on pedestals 33A-33F coupled to the bottom surface 34 through bellows 35A-35F, but without any fluid pressure applied to the interior cavity 39 and without any of pedestals 33A-33F being in contact with any electrical module the pedestals are intended to provide cooling for. The clearance spacing 74 includes a space that allows for the individual travel of the pedestals 33A-33F as illustrated by arrow 73 to be unobstructed by any potential contact between the upper surface of the fins and the interior side 11H of first portion 31.

FIG. 6 is a rear side elevational view 75 of the example cooling manifold of FIG. 3 in accordance with one or more example implementations and techniques described in this disclosure. In FIG. 6, manifold 11 is shown looking toward end wall 11G of second portion 32 of the manifold. Top surface 11A forms the upper perimeter of manifold 11, bottom surface 11F forms the lower perimeter of the manifold, sidewall 11D forms the right-hand side, and sidewall 11B forms the left-hand side of the perimeter of the manifold as illustrated in FIG. 6. Fluid coupling 40 including opening 42 and fluid coupling 41 including opening 43 are located on end wall 11G of manifold 11, and thus are shown as solid-line circles in FIG. 5.

As shown in FIG. 6, each of pedestals 33A-33F is coupled to bottom surface 34 of the first portion 31 of manifold 11 by bellows 35A-35F, respectively. Each of pedestals 33A-33F extends below the bottom surface 34 of the first portion 31 so that a ramp portion of each pedestal, illustratively indicated on pedestal 33A as ramp 38, would be visible if looking through second portion 32 of the manifold. Ramp 38 is the ramp portion of each pedestal that is located at the portion of the pedestal closest to step 11E of second portion 32. Ramp 38 may be configured to help engage any surfaces and/or edges on the exterior surface an electrical module that has been fully received in a module slot (not shown in FIG. 6) adjacent to pedestal 33A while the electrical module is being extracted (removed) from the module slot, and to aid in moving pedestal 33A in the direction indicated by arrow 73 to allow for easier extraction of the electrical module. Each of pedestals 33B-33F may include a ramp corresponding to ramp 38 of pedestal 33A, and which may perform any of the functions and provide any of the features describe above with respect to ramp 38 and pedestal 33A.

Figure 7:
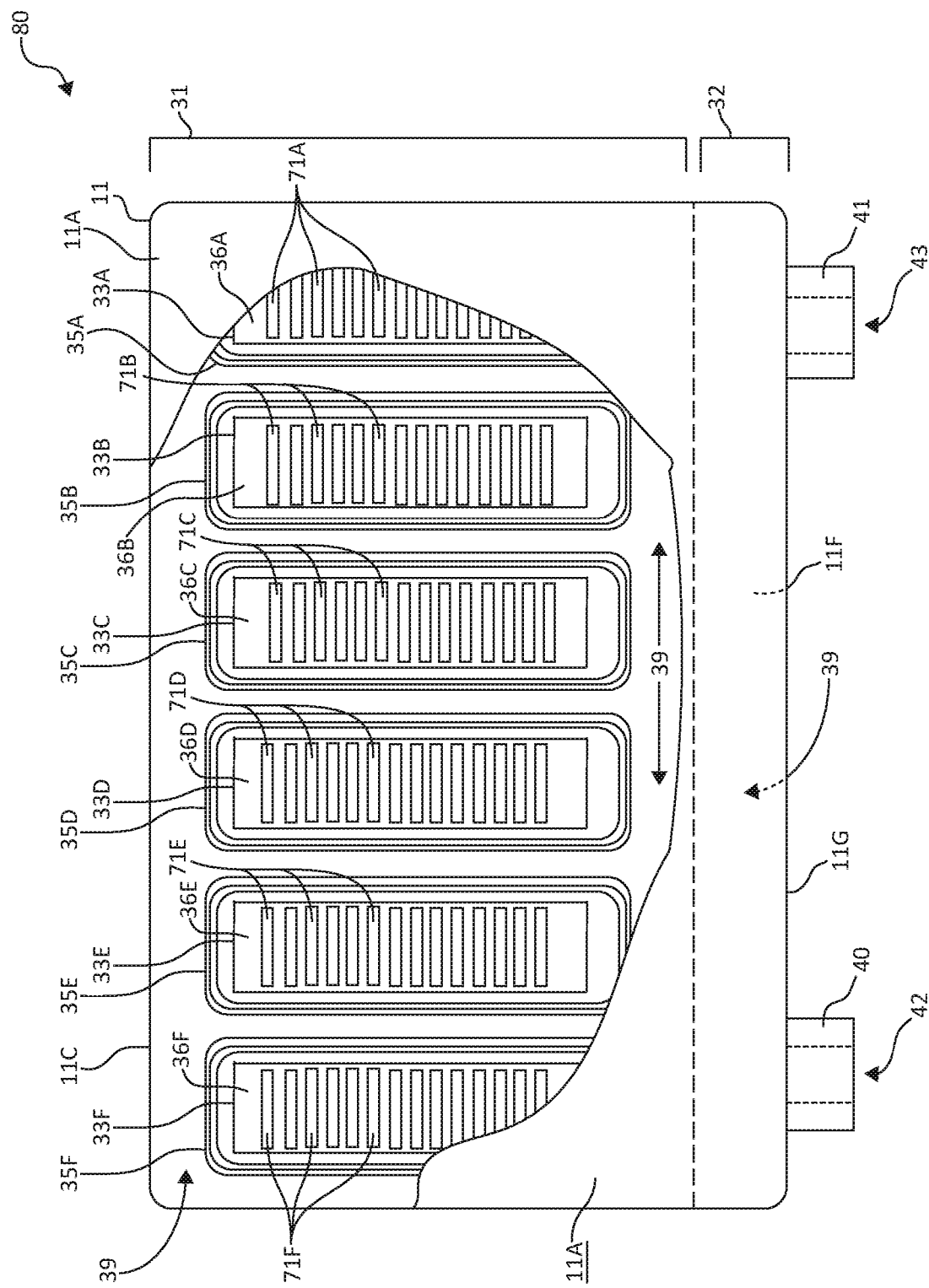
FIG. 7 is a top side cut away view of the example cooling manifold of FIG. 3 in accordance with one or more example implementations and techniques described in this disclosure.

FIG. 7 is a top side cutaway view 80 of the example cooling manifold of FIG. 3 in accordance with one or more example implementations and techniques described in this disclosure. As shown in FIG. 7, manifold 11 (including first portion 31 and second portion 32) is shown looking toward top surface 11A of the manifold, where top surface 11A is partially cutaway to show portions of interior cavity 39 and the interior surfaces 36A-36F of pedestals 33A-33F. Referring to pedestal 33E for purposes of illustration, pedestal 33E includes an interior surface 36E that is exposed to and in fluid communication with interior cavity 39. As such, interior surface 36E may be in thermal contact with any cooling fluid that is circulating within and throughout interior cavity 39, and thus configured is to transfer heat that was conducted through pedestal 33E to the interior surface 36E to the cooling fluid.

In addition, pedestal 33E includes a set of heat sink fins 71E extending from interior surface 36E in the direction of top surface 11A. The view of heat sink fins 71E as shown in FIG. 7 shows the top edges of the heat sink fins looking down toward the fins in a direction opposite and parallel to that direction that heat sink fins extend from the interior surface 36E. Heat sink fins 71E as illustrated in FIG. 7 include a row of parallel fins that are configured to allow a flow of cooling fluid to past and around each fin and between the fins. This arrangement of heat sink fins 71E is an illustrative and non-limiting example of an arrangement of a heat sink, such as heat sink fins, that may be coupled to interior surface 36E of pedestal 33E. Other types and arrangement of heat sinks and heat sink fins that may be coupled to the interior surface 36E of pedestal 33E are possible, and are contemplated for use with examples of cooling manifolds as described throughout this disclosure.

Figure 8:
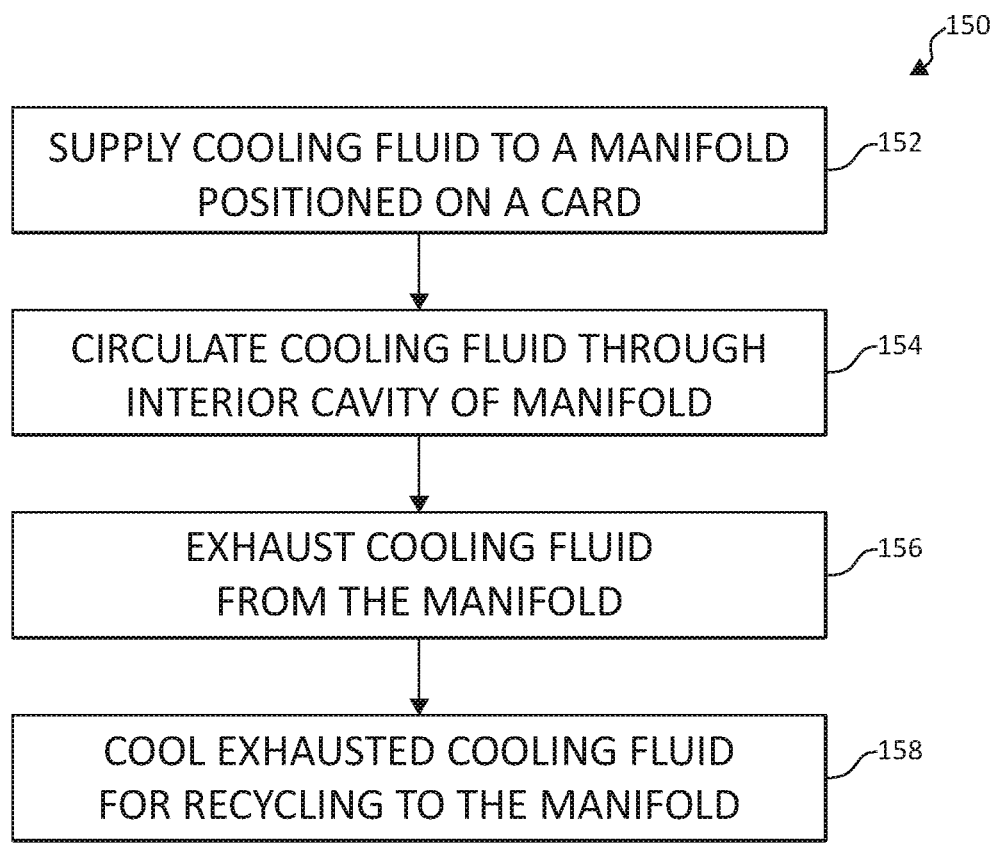
FIG. 8 is a flowchart of an example method for operating a cooling system including cooling manifolds in accordance with one or more example implementations and techniques described in this disclosure.

FIG. 8 is a flowchart of an example method 150 for operating a cooling system including cooling manifolds in accordance with one or more example implementations and techniques described in this disclosure. Method 150 is describe as being performed using manifold 11 and card(s) 10 illustrated and described throughout this disclosure. However, examples of method 150 are not necessarily limited to being executed using manifold 11 and assembly 10, or any equivalent thereof, and other versions of cooling manifolds that may be installed on an electrical or computer card and used for cooling slot-mounted electrical modules receive at the card may be utilized to perform method 150.

Method 150 includes supplying cooling fluid to manifold 11 positioned on an assembly 10 (block 152). Manifold 11 includes an interior cavity 39 configured to circulate a cooling fluid throughout the interior cavity, and a plurality of pedestals 33A-33F individually and flexibly coupled to a housing of the manifold through bellows 35A-35F, respectively, each of the pedestals configured to be physically and thermally coupled to an exterior surface of an electrical module received in a module slot adjacent to the pedestal. Each pedestal is configured to provide a thermal path for conducting heat between an exterior surface and an interior surface of the pedestal, wherein the interior surface of the pedestal is in fluid communication with interior cavity 39 of manifold 11. Each pedestal is configured to provide thermally cooling to at least one electrical module received in module slot of the card that is adjacent to the pedestal. Pedestals 33A-33F may be formed of a thermally conductive material, such as aluminum or copper. Pedestals 33A-33F may include heat sinks, such as a set of heat sink fins 71A-71F, that are thermally coupled to the interior surfaces 36A-36F, respectively, of the pedestals, the heat sinks extending into interior cavity 39 and in fluid communication with interior cavity 39.

Method 150 includes circulation a cooling fluid through interior cavity 39 of manifold 11. The cooling fluid may be provided to manifold 11 from a cooling system 9 (FIG. 1) that is located externally to assembly 10. Circulating the cooling fluid through manifold 11 may include receiving the cooling fluid provided from the externally located cooling system into interior cavity 39 through a first fluid opening (e.g., opening 42 or 43) of one of fluid couplings 40 or 41 of manifold 11. In various examples, the cooling fluid is a liquid. In various examples, the cooling fluid is water. Circulating the cooling fluid throughout interior cavity 39 includes transferring heat from the interior surfaces 36A-36F of the pedestals to the cooling fluid. Heat transferred to the cooling fluid includes heat that has been transferred from exterior surfaces of electrical modules received in module slots located adjacent pedestals 33A-33F to the interior surfaces 36A-36F of the pedestals through the pedestals and to the cooling fluid. Circulating the cooling fluid throughout interior cavity 39 may also include transferring heat to the cooling fluid from any heat sinks in thermal contact with interior surfaces 36A-36F of pedestals 33A-33F. Circulating the cooling fluid within interior cavity to transfer heat to the cooling fluid is configured to provide cooling of the electrical modules received in module slots located adjacent to the pedestal, including conduction of heat away from exterior surfaces of the individual electrical modules through the pedestals, and to transfer the heat from the interior surface of the pedestals to the cooling fluid.

Method 150 includes exhausting the cooling fluid from manifold 11. Exhausting the cooling fluid from manifold 11 through a second fluid opening (e.g., opening 42 or 43) of one of fluid couplings 40 or 41 of manifold 11 that is different for the fluid opening used to receive the cooling fluid from the external source of the cooling fluid. Exhausting cooling liquid from manifold 11 may include exhausting a portion of the cooling fluid from interior cavity 39 to the externally located cooling system. Exhausting the cooling fluid does require completely emptying the cooling fluid from interior cavity 39, or reducing the total amount of cooling fluid included within interior cavity 39, but may include exchanging some portion of the cooling fluid residing within the interior cavity with some cooling fluid newly received at the interior cavity. The rate of exhausting cooling fluid may be determined by and propelled by the rate and pressure of the cooling fluid as the cooling fluid is being newly received at the interior cavity 39 of manifold 11. Exhausting the cooling fluid from interior cavity 39 allows heat transferred to the cooling fluid from the interior surfaces of the pedestals 33A-33F to be carried away from the pedestals, the interior cavity 39, and the manifold 11 with the exhausted cooling fluid.

In some examples, method 150 includes cooling the exhausted cooling fluid for recycling to manifold 11. Examples of a cooling system configured cool the exhausted cooling fluid and recycle the cooled cooling fluid to manifold 11 include but are not limited to examples of cooling system 9 (FIG. 1). In various examples, recycling the cooling fluid includes conditioning the cooling fluid includes such processes as filtering the cooling fluid to remove and solids, such as particles, from the cooling fluid. Conditioning of the cooling fluid may include chemical treatment of the cooling fluid. Chemical treatment of the cooling fluid may include removal of impurities, such as rust or salts, that may be suspended or dissolved in the cooling fluid. Chemical treatment of the cooling fluid may include conditioning chemical, such as anti-corrosion compounds and/or anti-bacterial compounds, into the cool fluids to prevent corrosion and/or bacterial growth in the cooling fluid.

Various aspects of this disclosure have been described. These and other aspects are within the scope of the following claims.

What is claimed is:

1. A device comprising:
    a manifold comprising a housing that encloses an interior cavity, the interior cavity configured to receive a cooling fluid within the interior cavity and to circulate the cooling fluid throughout the interior cavity; and
    a plurality of pedestals, each of the pedestals individually and flexibly coupled to the housing and comprising an interior surface in fluid communication with the interior cavity, wherein each pedestal is configured to extend outward from a bottom surface of the housing when a fluid pressure is present within the interior cavity, and wherein each of the pedestals is formed from a thermally conductive material configured to transfer heat from an exterior surface of the pedestal to the interior surface of the pedestal through the thermally conductive material,
    wherein the manifold is configured to be positioned adjacent to a plurality of module slots of a faceplate assembly of a card, and each of the plurality of pedestals positioned adjacent to one of the plurality of module slots so that each of the pedestals, when extended away from the bottom surface of the housing, is configured to physically contact an electrical module received in respective module slots of the faceplate assembly adjacent to the pedestal and provide a thermal path to conduct heat from the electrical module to the interior cavity through the pedestal,
    wherein the interior cavity is configured to receive and contain the cooling fluid having the fluid pressure, and
    wherein the interior surface of each of the plurality of pedestals is configured to receive the fluid pressure at the interior surface and to exert a pressure through the pedestal onto the exterior surface of the electrical module received at the module slot adjacent to the pedestal based at least in part of the received fluid pressure.

2. The device of claim 1, wherein the plurality of pedestals are individually coupled to the bottom surface of the housing through a flexible bellows comprising a folded series of ridges and valleys.

3. The device of claim 1, wherein the plurality of pedestals are individually coupled to the bottom surface of the housing through a flexible bellows comprising beryllium copper.

4. The device of claim 1, wherein the plurality of pedestals are individually coupled to the bottom surface of the housing through a flexible bellows comprising a rubber compound.

5. The device of claim 1, wherein the plurality of pedestals are formed from a material comprising aluminum.

6. The device of claim 1, wherein the plurality of pedestals are formed from a material comprising copper.

7. The device of claim 1, wherein at least one pedestal of the plurality of pedestals comprises a flat planar top surface having a rectangular shape comprising a length and a width dimension configured to allow the top surface of the pedestal to physically contact and thermally couple to an exterior surface of the electrical module received in the module slot of the faceplate assembly adjacent to the pedestal.

8. The device of claim 7, wherein the at least one pedestal comprises a first ramp comprising a sloped surface extending from a pedestal base of the pedestal to a first end of the top surface of the pedestal, wherein the first ramp is configured to engage the exterior surface of the electrical module as the electrical module is being received in the module slot adjacent to the pedestal, and to urge the top surface of the pedestal in a direction toward the bottom surface of the housing to allow the electrical module to extend along the top surface of the pedestal as the electrical module is being inserted into the module slot.

9. The device of claim 8, wherein the at least one pedestal comprises a second ramp comprising a sloped surface extending from the pedestal base of the pedestal to a second end of the top surface of the pedestal, wherein the second ramp is configured to engage the exterior surface of the electrical module as the electrical module is being extracted from the module slot adjacent to the pedestal, and to urge the top surface of the pedestal in a direction toward the bottom surface of the housing to allow the electrical module to extracted from the module slot along the top surface of the pedestal.

10. The device of claim 1, wherein the housing is formed of a material comprising a thermally non-conductive material.

11. The device of claim 1, wherein at least one pedestal of the plurality of pedestals comprises a set of heat sink fins coupled to the interior surface of the at least one pedestal.

12. The device of claim 1, wherein the housing comprises a first portion in fluid communication with a second portion, wherein the first portion comprises the bottom surface having the plurality of pedestals individually and flexibly coupled to the bottom surface, and wherein the second portion comprises a second portion bottom surface configured to be mechanically coupled to a circuit board of the card where the manifold is to be installed to secure a position of the manifold relative to the faceplate assembly of the card.

13. A cooling system for an electrical or computer card, the cooling system comprising:
  a circuit board comprising a faceplate assembly, the faceplate assembly comprising a plurality of module slots, each module slot configured to receive and slot-mountable electrical module and electrically couple to the electrical module once the electrical module is received in the module slot;
  at least one manifold secured to the circuit board or to the faceplate assembly, and positioned adjacent to the faceplate assembly, the at least one manifold comprising:
    a housing that encloses an interior cavity, the interior cavity configured to receive a cooling fluid within the interior cavity and to circulate the cooling fluid throughout the interior cavity,
    a plurality of pedestals, each of the pedestals individually and flexibly coupled to the housing and comprising an interior surface in fluid communication with the interior cavity, wherein each pedestal is configured to extend outward from a bottom surface of the housing when a fluid pressure is present within the interior cavity, and wherein each of the pedestals is formed from a thermally conductive material configured to transfer heat from an exterior surface of the pedestal to the interior surface of the pedestal through the thermally conductive material,
    wherein the manifold is positioned to have each of the plurality of pedestals positioned adjacent to one of the plurality of module slots so that each of the pedestals, when extended away from the bottom surface of the housing, is configured to physically contact an electrical module received in the module slot of the faceplate assembly adjacent to the pedestal and provide a thermal path to conduct heat from the electrical module to the interior cavity through the pedestal; and
  a set of tubing coupling the at least one manifold to a source of cooling fluid, the tubing configured to provide fluid communication between the source of cooling fluid and the at least one manifold.

14. The system of claim 13, wherein the at least one manifold includes a plurality of manifolds, each of the plurality of manifolds secured to the circuit board or to the faceplate assembly, wherein each of the plurality of manifolds comprises a plurality of pedestals positioned adjacent to a different set of module slots of the faceplate assembly, and wherein each of the plurality of pedestals is configured to provide cooling to an electrical module received in a module slot of the set of module slots that is located adjacent to the pedestal.

15. The system of claim 14, wherein the set of tubing is configured to couple each of the plurality of manifolds to the source of the cooling fluid.

16. The system of claim 13, wherein the plurality of pedestals are individually coupled to the bottom surface of the housing through a flexible bellows.

17. The system of claim 13, wherein the plurality of pedestals are formed from a material comprising aluminum.

18. A method comprising:
  supplying a cooling fluid to a manifold, the manifold coupled to a card configured to be installed and electrically powered in a computer card rack, the manifold positioned adjacent to and configured to thermally cool a plurality of slot-mountable electrical modules received in a set of module slot of the card while the card in installed within a card slot of the computer card rack; and
  circulating a cooling fluid through an interior cavity of the manifold to transfer heat from a surface of the at least one of the electrical modules through a portion of the housing of the manifold and to the cooling fluid to thermally cool the at least one electrical module received in a module slot of the card,
  wherein the manifold comprises:

a housing that encloses an interior cavity, the interior cavity configured to receive the cooling fluid within the interior cavity and to circulate the cooling fluid throughout the interior cavity;

a plurality of pedestals, each of the pedestals individually and flexibly coupled to the housing and comprising an interior surface in fluid communication with the interior cavity, wherein each pedestal is configured to extend outward from a bottom surface the housing when a fluid pressure is present within the interior cavity, and wherein each of the pedestals is formed from a thermally conductive material configured to transfer heat from top surface of the pedestal to the interior surface of the pedestal through the thermally conductive material, wherein the manifold having each of the plurality of pedestals positioned adjacent to one of the plurality of module slots so that the each of the pedestals, when extended away from the bottom surface of the housing, comes into physical contact with an electrical module received in the module slot of the faceplate assembly adjacent to the pedestal and provides a thermal path to conduct heat from the electrical module to the interior cavity through the pedestal.

19. The method of claim 18, wherein the plurality of pedestals are individually coupled to the bottom surface of the housing through a flexible bellows.

* * * * *